(12) United States Patent
Shirahata et al.

(10) Patent No.: US 11,124,877 B2
(45) Date of Patent: Sep. 21, 2021

(54) FILM FORMING DEVICE INCLUDING A DETACHABLE BOTTOM PLATE FOR FORMING A FILM ON A SUBSTRATE

(71) Applicant: TOSHIBA MITSUBISHI-ELECTRIC INDUSTRIAL SYSTEMS CORPORATION, Chuo-ku (JP)

(72) Inventors: Takahiro Shirahata, Tokyo (JP); Hiroyuki Orita, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 1 day.

(21) Appl. No.: 15/760,285

(22) PCT Filed: Oct. 19, 2015

(86) PCT No.: PCT/JP2015/079447
§ 371 (c)(1),
(2) Date: Mar. 15, 2018

(87) PCT Pub. No.: WO2017/068624
PCT Pub. Date: Apr. 27, 2017

(65) Prior Publication Data
US 2018/0264498 A1    Sep. 20, 2018

(51) Int. Cl.
*C23C 16/455*    (2006.01)
*C23C 16/44*    (2006.01)
(Continued)

(52) U.S. Cl.
CPC ........ *C23C 16/45563* (2013.01); *B05B 7/025* (2013.01); *B05B 7/08* (2013.01);
(Continued)

(58) Field of Classification Search
CPC .......................... C23C 16/44; C23C 16/45563
See application file for complete search history.

(56) References Cited

U.S. PATENT DOCUMENTS 5,478,224 A * 12/1995 McGuffey ............... B05B 7/025
118/302
5,773,080 A *  6/1998 Simmons .............. B05C 5/0279
427/177

(Continued)

FOREIGN PATENT DOCUMENTS

JP        07-002548 A      1/1995
JP      2001-107247 A      4/2001
(Continued)

OTHER PUBLICATIONS

Office Action dated Aug. 7, 2019 in Chinese Application No. 201580083959.9, along with an English translation.

(Continued)

*Primary Examiner* — Karl Kurple
(74) *Attorney, Agent, or Firm* — Xsensus LLP

(57) ABSTRACT

A film forming device includes a bottom plate detachably provided on a bottom surface of a mist spray head. The bottom plate includes a raw material solution opening, reaction material openings, and inert gas openings formed in regions corresponding to a raw material solution ejection port, reaction material ejection ports, and inert gas ejection ports, when the bottom plate is attached to the bottom surface of the mist spray head.

18 Claims, 7 Drawing Sheets

(51) Int. Cl.
  *B05B 12/14* (2006.01)
  *B05B 7/08* (2006.01)
  *B05B 7/24* (2006.01)
  *C23C 18/12* (2006.01)
  *B05B 12/18* (2018.01)
  *C23C 16/458* (2006.01)
  *B05B 14/30* (2018.01)
  *B05B 7/02* (2006.01)
  *B05B 13/02* (2006.01)

(52) U.S. Cl.
  CPC ............ *B05B 7/24* (2013.01); *B05B 12/1472* (2013.01); *B05B 12/18* (2018.02); *B05B 13/0278* (2013.01); *B05B 14/30* (2018.02); *C23C 16/4401* (2013.01); *C23C 16/4412* (2013.01); *C23C 16/4586* (2013.01); *C23C 16/45574* (2013.01); *C23C 16/45595* (2013.01); *C23C 18/1275* (2013.01); *C23C 18/1279* (2013.01)

(56) References Cited

U.S. PATENT DOCUMENTS

| | | | | |
|---|---|---|---|---|
| 5,853,482 | A * | 12/1998 | Gartmann | B01D 19/0021 118/419 |
| 5,904,773 | A * | 5/1999 | Himes | B08B 3/022 118/314 |
| 6,045,874 | A * | 4/2000 | Himes | B08B 3/022 34/380 |
| 6,302,964 | B1 * | 10/2001 | Umotoy | C23C 16/45514 118/715 |
| 6,423,139 | B1 * | 7/2002 | Shimai | B05C 5/0254 118/300 |
| 6,457,608 | B1 * | 10/2002 | Riney | B05C 5/0279 222/135 |
| 6,695,923 | B1 * | 2/2004 | Schultz | B05B 13/0431 118/323 |
| 6,708,903 | B2 * | 3/2004 | Kanno | B01F 3/04049 239/426 |
| 6,942,753 | B2 * | 9/2005 | Choi | C23C 16/45565 118/715 |
| 7,332,035 | B1 * | 2/2008 | Tudor | B05B 13/0431 118/315 |
| 7,913,938 | B2 * | 3/2011 | Cooper | B05B 5/03 239/690 |
| 8,100,169 | B2 * | 1/2012 | Rini | A61P 17/02 165/80.4 |
| 8,657,959 | B2 * | 2/2014 | Nunes | C23C 16/4412 118/58 |
| 9,138,760 | B2 * | 9/2015 | Cooper | B05B 7/066 |
| 9,144,811 | B2 * | 9/2015 | Cooper | B05B 7/066 |
| 9,745,659 | B1 * | 8/2017 | Cho | B05B 9/0403 |
| 10,118,191 | B2 * | 11/2018 | Shirahata | B05C 9/14 |
| 2003/0089799 | A1 * | 5/2003 | Kanno | B01F 3/04049 239/434 |
| 2004/0001116 | A1 * | 1/2004 | Wouters | B41J 2/16552 347/28 |
| 2004/0067641 | A1 * | 4/2004 | Yudovsky | C23C 16/4412 438/680 |
| 2004/0206305 | A1 * | 10/2004 | Choi | C23C 16/45565 118/715 |
| 2005/0092435 | A1 * | 5/2005 | Hayashi | H01J 37/3244 156/345.24 |
| 2006/0124780 | A1 * | 6/2006 | Cooper | B05B 5/03 239/690 |
| 2010/0108108 | A1 * | 5/2010 | Hayashi | H01L 21/02063 134/115 R |
| 2010/0215871 | A1 * | 8/2010 | Lee | C23C 16/06 427/569 |
| 2010/0224665 | A1 * | 9/2010 | Vinnay | B05B 7/08 226/102 |
| 2011/0086167 | A1 * | 4/2011 | Nunes | C23C 16/4412 427/249.17 |
| 2011/0097489 | A1 * | 4/2011 | Kerr | C23C 16/45591 427/248.1 |
| 2014/0134768 | A1 * | 5/2014 | Jang | C23C 16/403 438/28 |
| 2014/0186990 | A1 * | 7/2014 | Kusuhara | C23C 16/50 438/72 |
| 2015/0101535 | A1 * | 4/2015 | Lee | C23C 16/45536 118/712 |
| 2015/0275362 | A1 * | 10/2015 | Jang | C23C 16/45574 427/255.28 |
| 2016/0273105 | A1 * | 9/2016 | de Ridder | C23C 16/45574 |
| 2017/0274410 | A1 * | 9/2017 | Shirahata | C23C 16/45563 |
| 2017/0314126 | A1 * | 11/2017 | Tjandra | H01L 21/67115 |
| 2018/0202046 | A1 * | 7/2018 | Savas | H01J 37/32036 |
| 2018/0342675 | A1 * | 11/2018 | Xu | H01L 51/001 |
| 2020/0071830 | A1 * | 3/2020 | Lee | H01L 21/02101 |
| 2020/0131637 | A1 * | 4/2020 | Chen | C23C 16/45563 |
| 2020/0240014 | A1 * | 7/2020 | Shono | C23C 16/45563 |

FOREIGN PATENT DOCUMENTS

| | | |
|---|---|---|
| KR | 10-2009-0101918 A | 9/2009 |
| KR | 10-2013-0087560 A | 8/2013 |
| WO | 2012/124047 A1 | 9/2012 |
| WO | 2013/038484 A1 | 3/2013 |

OTHER PUBLICATIONS

Office Action dated May 26, 2020 in Korean Patent Application No. 10-2018-7010629, 8 pages.

International Search Report dated Jan. 12, 2016, in PCT/JP2015/079447, filed Oct. 19, 2015.

* cited by examiner

F I G. 2
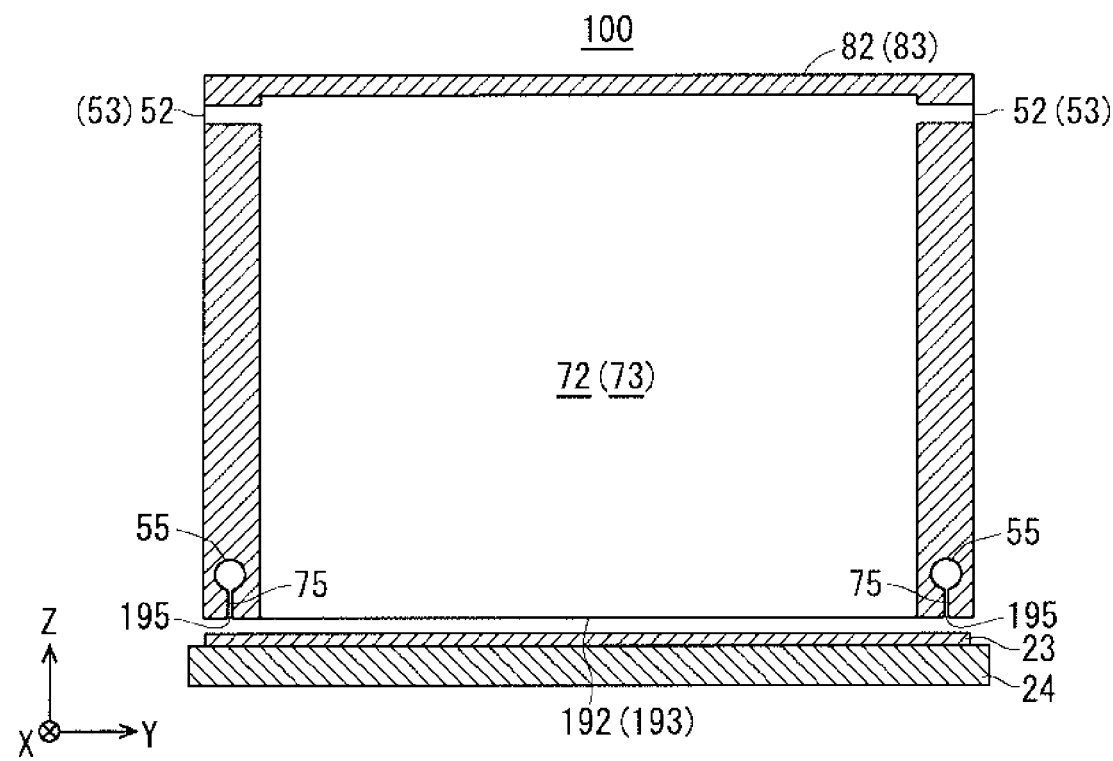
F I G. 3
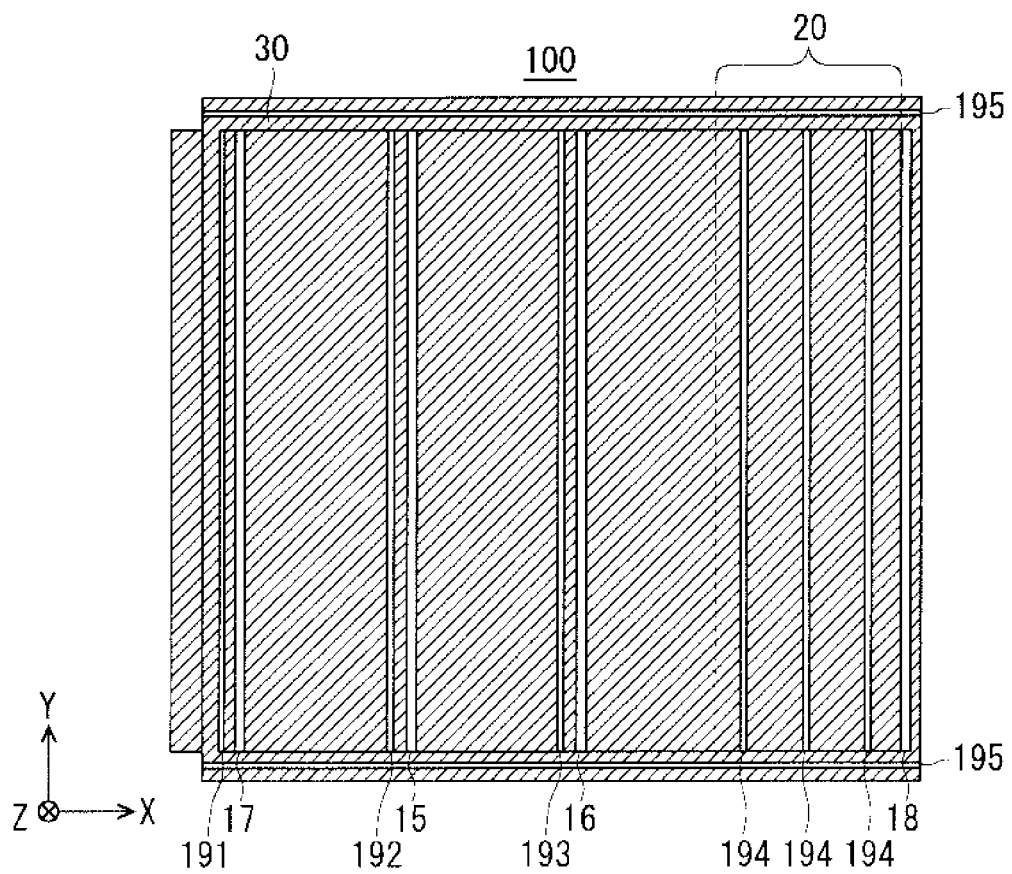

F I G . 6
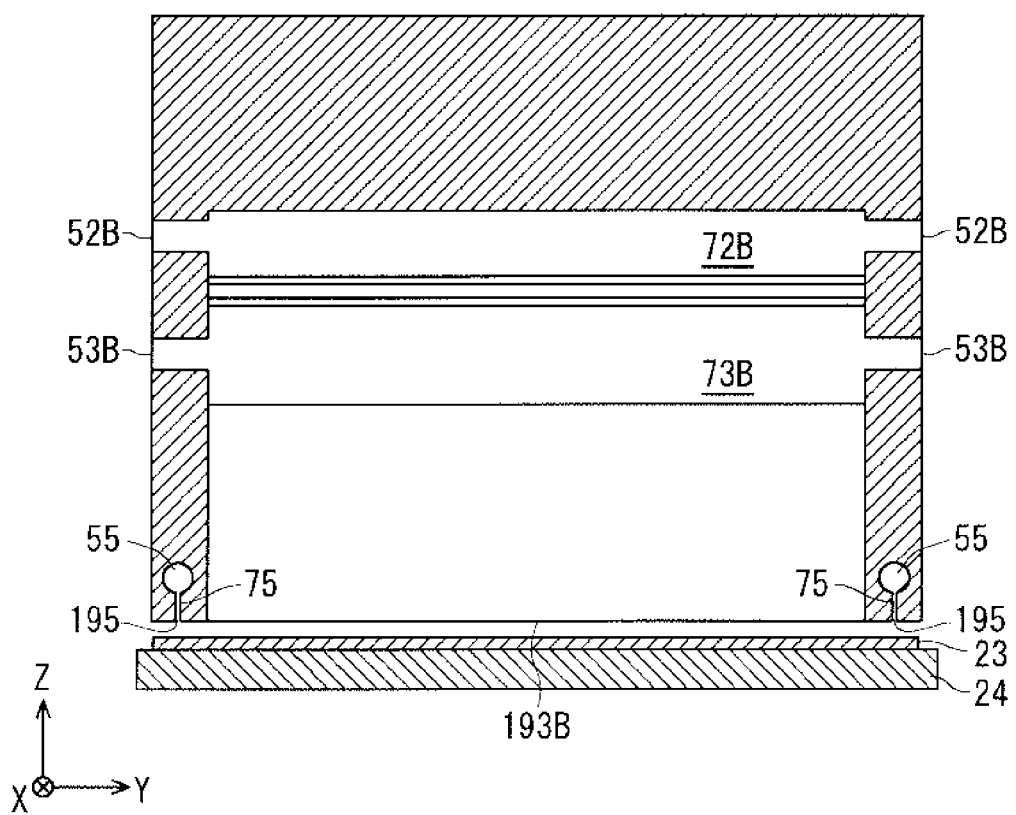

F I G. 7
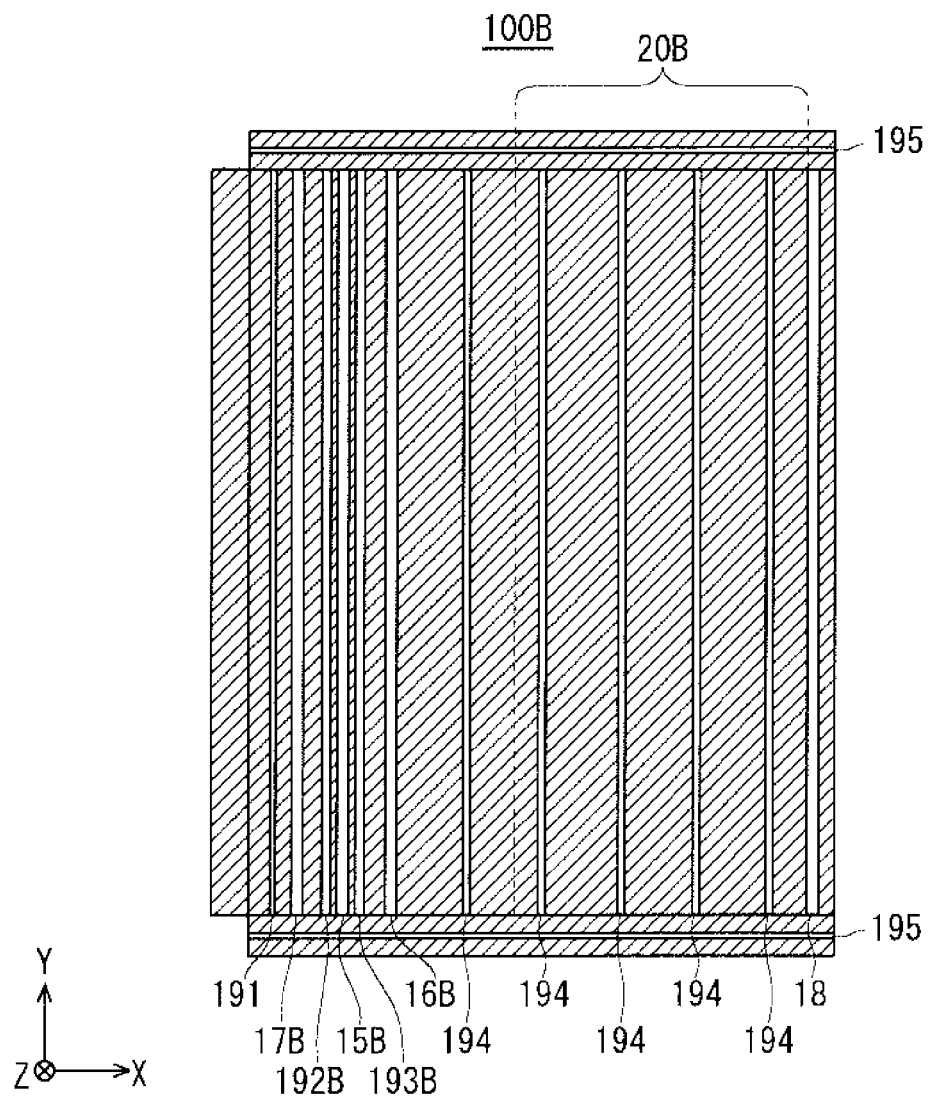

FILM FORMING DEVICE INCLUDING A DETACHABLE BOTTOM PLATE FOR FORMING A FILM ON A SUBSTRATE

TECHNICAL FIELD

The present invention relates to a film forming device for forming a film on a substrate.

BACKGROUND ART

As a method of forming a film on a substrate, there is a chemical vapor deposition (CVD) method. However, in the chemical vapor deposition method, it is often necessary to form a film under vacuum, and in addition to a vacuum pump or the like, there is a case where it is necessary to use a large vacuum container. Further, in the chemical vapor deposition method, there has been a problem that it is difficult to adopt a substrate having a large area as a substrate to be formed from the viewpoint of cost and the like. Therefore, a mist method capable of film forming processing under atmospheric pressure attracts attention.

As a conventional technique relating to a film forming device or the like utilizing a mist method, for example, there is a technique according to Patent Document 1.

In the technique according to the Patent Document 1, atomized raw material solution and reaction material are sprayed from a raw material solution ejection port and a reaction material ejection port provided in the bottom surface of the mist spray head including a mist spray nozzle or the like to a substrate disposed in the atmosphere. By this spraying, a predetermined film is formed on the substrate. The reaction material means a material which contributes to a reaction with the raw material solution.

PRIOR ART DOCUMENT

Patent Document

Patent Document 1: International Publication No. 2013/038484

SUMMARY

Problem to be Solved by the Invention

As described above, the film forming processing using the conventional film forming device is a process of forming a predetermined film on the substrate in the atmosphere (under atmospheric pressure) after obtaining a reaction product by reacting the atomized raw material solution and the reaction material. Therefore, when the conventional film forming device is used for a long time, the reaction product gradually adheres to the bottom surface of the mist spray head 100 due to the ascending air current caused by heating the substrate. In order to remove the adhered reaction products, the bottom surface of the mist spray head needs to be periodically cleaned, but there has been a problem that labor is required for cleaning.

It is an object of the present invention to solve the above problems and to provide a film forming device having a structure for easily removing adhered reaction products.

Means to Solve the Problem

A film forming device according to the present invention is a film forming device that forms a film on a substrate by spraying an atomized raw material solution in an atmosphere the film forming device including:

a mount on which the substrate is mounted;

a mist spray head which is provided opposed to an upper surface of the substrate mounted on the mount, has a raw material solution ejection port and an exhaust port at the bottom surface, and sprays the raw material solution from the raw material solution ejection port to perform an exhaust processing from the exhaust port; and a bottom plate detachably provided on the bottom surface of the mist spray head, wherein the bottom plate is attached to the bottom surface of the mist spray head such that it does not disturb the forming of the film.

Effects of the Invention

The film forming device of the present invention according to claim 1 achieves the effect that reaction products adhering to the bottom plate can be easily removed by providing a detachable bottom plate on the bottom surface of the mist spray head and washing the bottom plate after removing the bottom plate.

Further, with the film forming device of the present invention, it is possible to keep on using a film forming device while cleaning a bottom plate by preparing a plurality of bottom plates in advance and using another washed bottom plate while one bottom plate among the plurality of bottom plates is cleaned.

The objects, features, aspects, and advantages of the present invention will become more apparent from the following detailed description and the accompanying drawings.

BRIEF DESCRIPTION OF DRAWINGS

FIG. 2 is a cross sectional view showing a cross sectional structure taken along line A-A of FIG. 1.

FIG. 3 is a plan view of the mist spray head of Embodiment 1, as viewed from a bottom surface side.

FIG. 6 is a cross sectional view showing a cross sectional structure taken along line C-C of FIG. 5.

FIG. 7 is a plan view of the mist spray head of Embodiment 2 as viewed from a bottom surface side.

DESCRIPTION OF EMBODIMENTS

Hereinafter, the present invention will be described in detail with reference to the drawings illustrating its embodiments.

Embodiment 1

(Overall Structure)

Figure 1:
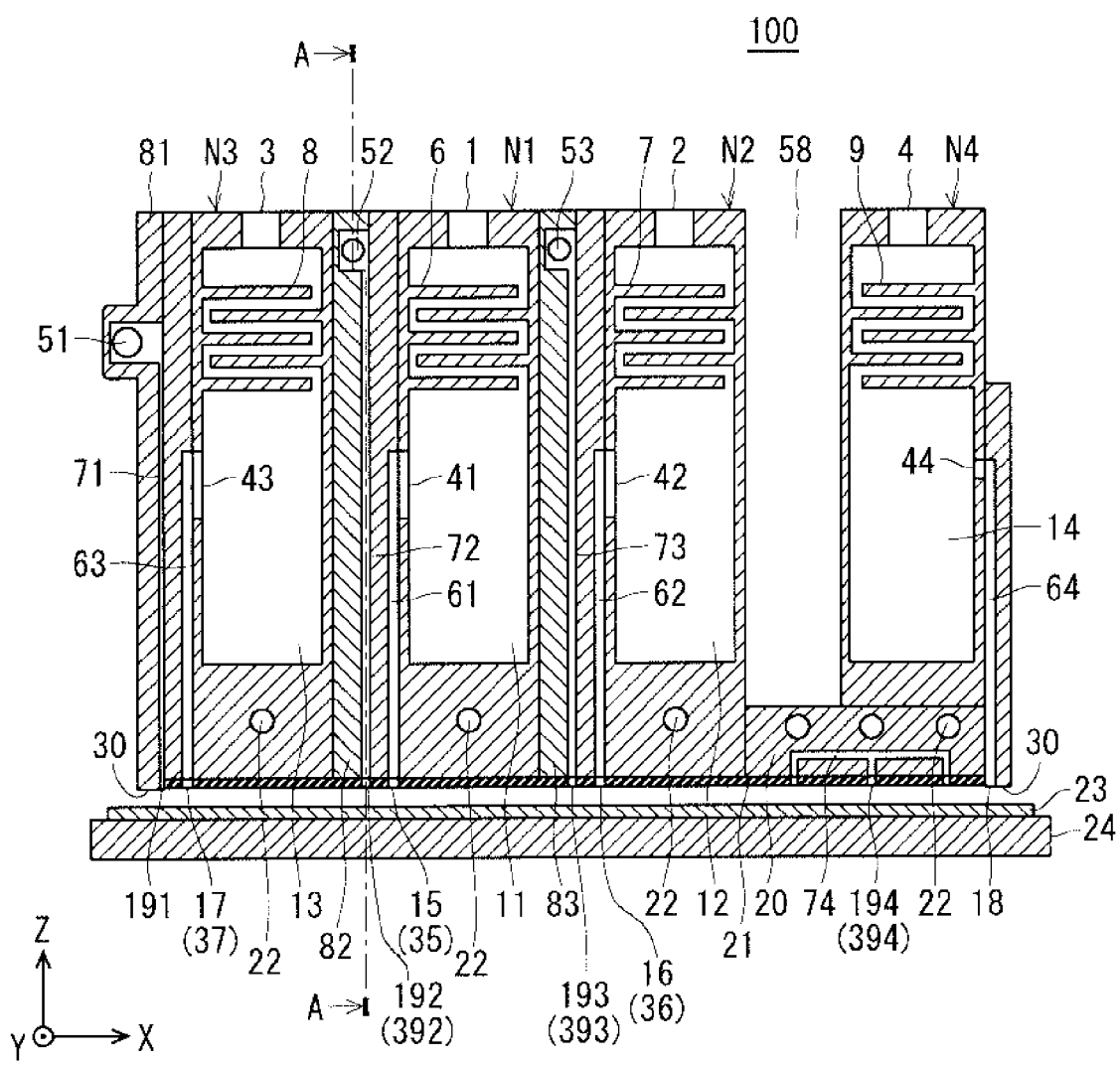
FIG. 1 is a cross sectional view showing a mist spray head of a film forming device according to Embodiment 1 of the present invention.
Figure 4:
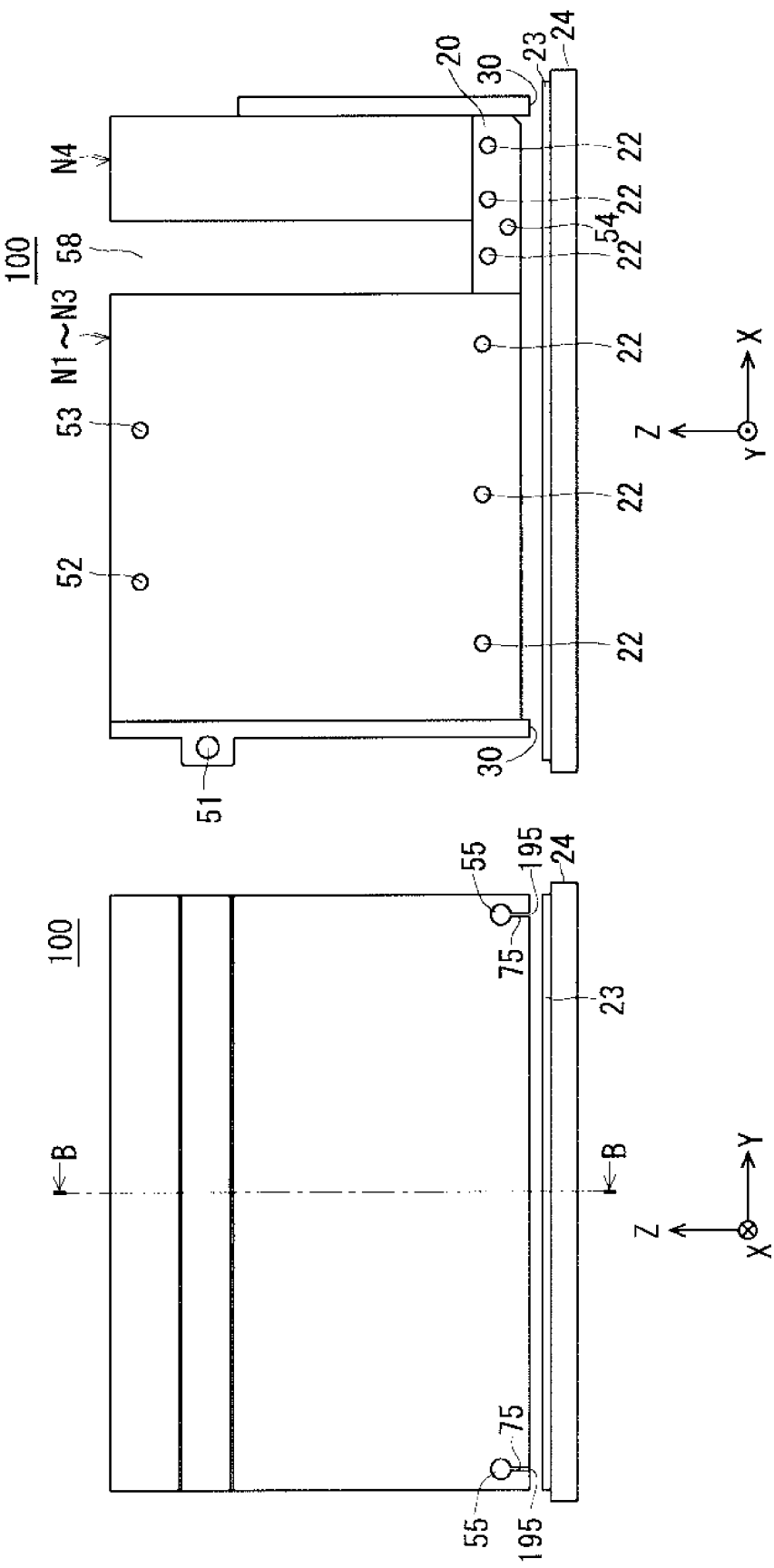
FIGS. 4A and 4B are explanatory views showing an appearance structure and the like of a base plate of Embodiment 1.

FIG. 1 is a cross sectional view showing a mist spray head 100 and its periphery which are main components of a film forming device according to Embodiment 1 of the present invention. FIG. 2 is a cross sectional view showing a cross sectional structure taken along line A-A of FIG. 1. In FIGS. 1 and 2 and in FIGS. 3 to 8 shown later, XYZ orthogonal coordinate axes are also shown. Also, in FIG. 2, the bottom plate 21 is omitted.

In the film forming device of Embodiment 1, a film is formed on a substrate 23 by spraying an atomized raw material solution in the atmosphere by the mist spray head 100. That is, the film forming device is a device for forming a desired film on the substrate 23 by the mist method, which is a film forming processing in the atmosphere.

Specifically, the raw material solution is contained in a container (not shown), and the raw material solution is atomized in the container by utilizing ultrasonic vibration. Then, the atomized raw material solution is transported to the mist spray head 100 through a path not shown together with the carrier gas.

A substrate 23 is disposed on a mounting part 24 which is also a heater. That is, the mounting part 24 can heat the substrate 23. Then, the mist spray head 100 is disposed above the substrate 23.

That is, an upper surface of the substrate 23 and a bottom surface of the mist spray head 100 (more precisely, a lower surface of the bottom plate 21) are arranged so as to be opposed to each other at a predetermined distance. Here, at the time of film forming processing, a distance between the bottom surface of the mist spray head 100 and the upper surface of the substrate 23 is set to about 0.1 mm to 50 mm. The mist spray head 100 and the substrate 23 are disposed at atmospheric pressure. Here, the space formed between the bottom surface of the mist spray head 100 and the upper surface of the substrate 23 is referred to as "reaction space".

The mist spray head 100 sprays the atomized raw material solution to the substrate 23 which is heated at a predetermined temperature by the mounting part 24. Thereby, a desired film is formed on the upper surface of the substrate 23. The mounting part 24 moves in a horizontal direction (predetermined direction defined in an X-Y plane) at the time of film forming processing. Alternatively, the mist spray head 100 moves in the above-mentioned horizontal direction.

Hereinafter, the configuration of the mist spray head 100 will be specifically described with reference to the drawings.

As shown in FIG. 1, the mist spray head 100 includes a raw material solution spray nozzle N1, two reaction material spray nozzles N2 and N3, an exhaust nozzle N4, a base plate 20, a bottom plate 21.

As shown in FIG. 1, the reaction material spray nozzle N3, the raw material solution spray nozzle N1, the reaction material spray nozzle N2, and the exhaust nozzle N4 are arranged side by side in this order along the X direction. Differing from the configuration shown in FIG. 1, it is also applicable to arrange the reaction material spray nozzle N2, the raw material solution spray nozzle N1, the reaction material spray nozzle N3, and the exhaust nozzle N4 side by side in this order along the X direction.

Although the raw material solution spray nozzle N1 and the reaction material spray nozzles N2 and N3 are provided with the inert gas spray parts 82 and 83 interposed therebetween, a side surface of the reaction material spray nozzle N2 and a side surface of the exhaust nozzle N4 are separated by a predetermined distance. That is, the raw material solution spray nozzle N1 and the reaction material spray nozzles N2 and N3 are disposed with no clearance along the X direction (horizontal direction) with the inert gas spray parts 82 and 83 interposed therebetween, and the exhaust nozzle N4 is disposed separately from (spaced apart from) other nozzles N1 to N3 in the X direction.

As described above, the raw material solution spray nozzle N1, the reaction material ejection spray nozzles N2 and N3, and the exhaust nozzle N4 are arranged side by side in the horizontal direction (X direction). Here, at least the exhaust nozzle N4 is located at the outermost side (the right end (X direction) in FIG. 1) of the mist spray head 100.

(Raw Material Solution Spray Nozzle N1)

First, the configuration of the raw material solution spray nozzle N1 will be described.

The raw material solution spray nozzle N1 is a nozzle for spraying the atomized raw material solution from the raw material solution ejection port 15 formed in the bottom surface. In the raw material solution spray nozzle N1, a cavity 11 (first cavity) is formed. Further, on the upper surface of the raw material solution spray nozzle N1, a raw material solution supply part 1 is disposed. As described above, the raw material solution is atomized outside the mist spray head 100. The atomized raw material solution is transported to the raw material solution supply part 1 through a path not shown together with the carrier gas. The atomized raw material obtained from the raw material solution supply part 1 fills (is supplied to) the cavity 11 in the raw material solution spray nozzle N1.

In addition, a plurality of flow-regulating parts 6 (first flow-regulating part) are provided on both side surface portions in the cavity 11 of the raw material solution spray nozzle N1. The flow-regulating part 6 is a flow-regulating plate, and can regulate the flow in the cavity 11 of the atomized raw material solution supplied from the raw material solution supply part 1. Specifically, a plurality of flow-regulating parts 6 having a rectangular shape in plan view are arranged from the opposite side surfaces in the X-Y plane with alternately changing the formation heights in the cavity 11. Each of the plurality of flow-regulating parts 6 is configured so as to form a clearances with an opposite side surface without reaching the opposite side surface A main part of the cavity 11 is provided below the plurality of flow-regulating parts 6. A small space (of the cavity 11) above the plurality of flow-regulating parts 6 is connected to (the main part of) the cavity 11 through a clearance formed by the plurality of the flow-regulating parts 6, and the cavity 11 is connected to the raw material solution discharge part 41 described later.

The raw material solution discharge part 41 is provided in one side surface portion (side surface on the left (−X direction) side in FIG. 1) in the cavity 11. Further, the raw material solution discharge part 41 is disposed at a position away from a bottom surface of the raw material solution spray nozzle N1 (cavity 11).

On the other hand, as described above, the raw material solution ejection port 15 is provided in the bottom surface of the mist spray head 100, that is, the surface of the mist spray head 100 which corresponds to the upper surface of the substrate 23. Here, the atomized raw material solution is ejected from the raw material solution ejection port 15 to the upper surface of the substrate 23 via the raw material solution opening 35 of the bottom plate 21 which will be described later.

A passage 61 extending in the direction is disposed in the mist spray head 100. Then, the raw material solution discharge part 41 is connected to the raw material solution ejection port 15 via the passage 61.

FIG. 3 is a plan view of the mist spray head 100 in a state in which the bottom plate 21 is removed, as viewed from a side where the substrate 23 is disposed (-Z direction side). That is, FIG. 3 is a plan view showing a bottom surface structure of the mist spray head 100. As shown in the drawing, the bottom surface of the mist spray head 100 assumes a rectangular shape defined by an X direction (second direction) and a Y direction (first direction).

As shown in FIG. 3, the raw material solution ejection port 15 assumes a slit shape which is an elongated opening whose longitudinal direction is a Y direction (first direction) in plan view. A width of the opening of the raw material solution ejection port 15 (dimension in the X direction in FIG. 3) is about 0.1 mm to 10 mm.

In the raw material solution spray nozzle N1, the atomized raw material solution is supplied into the cavity 11 from the raw material solution supply part 1. Then, the raw material solution is regulated by the plurality of flow-regulating parts 6, fills the small space above the plurality of flow-regulating parts 6, then is guided to the cavity 11, and fills the cavity 11. Thereafter, the atomized raw material solution is guided from the raw material solution discharge part 41 to the raw material solution ejection port 15 via the passage 61. Then, the atomized raw material solution is ejected from the raw material solution ejection port 15 toward the upper surface of the substrate 23.

(Reaction Material Spray Nozzles N2 and N3)

Next, the configuration of the reaction material spray nozzles N2 and N3 (first and second reaction material spray nozzles) will be described. Since the first and second reaction materials to be sprayed are independent of each other and the constitutions of the reaction material spray nozzles N2 and N3 are the same except forming positions, in the following description, the explanation will be made around the reaction material spray nozzle N2 with reference to the explanation of the reaction material spray nozzle N3 as appropriate.

Between the reaction material spray nozzles N2 and N3, a plurality of flow-regulating parts 7 and 8, reaction material supply parts 2 and 3, cavities 12 and 13, reaction material discharge parts 42 and 43, passages 62 and 63, and the reaction material ejection ports 16 and 17 (first and second reaction material ejection ports) each have a relation of corresponding to each other. In addition, the first and second reaction materials used in the reaction material spray nozzles N2 and N3, respectively, may be the same or different.

The reaction material spray nozzle N2 is a nozzle which ejects a reaction material (e.g., oxidizing agent) contributing to the reaction with the raw material solution to the substrate 23. A cavity 12 (a second cavity) is formed in the reaction material spray nozzle N2. Further, a reaction material supply part 2 is provided in the upper surface, of the reaction material spray nozzle N2. The reaction material (first reaction material) is supplied from the outside of the reaction material spray nozzle N2 to the inside of the cavity 12 via the reaction material supply part 2. On the other hand, in the reaction material spray nozzle N3, the reaction material (second reaction material) is supplied from the outside of the reaction material spray nozzle N3 to the inside of the cavity 13 via the reaction material supply part 3 provided in the upper surface.

Here, the first and second reaction materials may be gas or liquid. In the case of a liquid, the liquid (reaction material) atomized by using ultrasonic vibration or the like is transported into the reaction material spray nozzle N2 (N3) through a path not shown together with the carrier gas. The first reaction material (second reaction material) obtained from the reaction material supply part 2 (3) fills (is supplied to) the cavity 12 (13) in the reaction material spray nozzle N2 (N3).

In addition, a plurality of flow-regulating parts 7 (second flow-regulating part) are provided in the cavity 12 of the reaction material spray nozzle N21. The flow-regulating part 7 is a flow-regulating plate, and can mainly regulate the flow in the cavity 12 of the reaction material supplied from the reaction material supply part 2. Specifically, a plurality of flow-regulating parts 7 having a rectangular shape in plan view are arranged from the opposite side surfaces in the X-Y plane with alternately changing the formation heights in the cavity 12. Each of the plurality of flow- regulating parts 7 is configured so as to form a clearances with an opposite side surface without reaching the opposite side surface.

In the reaction material spray nozzle N2 (N3), the small space (in the cavity 12) above the plurality of flow-regulating parts 7 (8) and the main part of the cavity 12 (13) are connected to each other via a clearance formed by the plurality of flow-regulating parts 7 (8). Further, the small space is connected to the reaction material supply part 2 (3), and the cavity 12 (13) is connected to a reaction material discharge part 42 (43) described later.

The reaction material discharge part 42 is provided in one side surface portion (side surface on the left (−X direction) side in FIG. 1) in the cavity 12. Further, the reaction material discharge part 42 is disposed at a position away from a bottom surface of the reaction material spray nozzle N2 (cavity 12).

On the other hand, in the mist spray head 100, a reaction material ejection port 16 is provided in the bottom surface of the mist spray head 100, that is, in the side of the mist spray head 100 which faces the substrate 23. Here, the reactive material is ejected from the reaction material ejection port 16 (17) to the upper surface of the substrate 23 via the reaction material opening 36 (37) of the bottom plate 21.

A passage 62 (63) is provided along the Z direction in the mist spray head 100. The reaction material discharge part 42 (43) is connected to the reaction material ejection port 16 (17) via the passage 62 (63). As shown in FIG. 3, each of the reaction material ejection ports 16 and 17 assumes a slit shape which is an elongated opening whose longitudinal direction is a Y direction (first direction) in plan view. The width of the opening of each of the reaction material ejection ports 16 and 17 (dimension in the X direction in FIG. 3) is about 0.1 mm to 10 mm.

In the reaction material spray nozzle N2 (N3), the reaction material is supplied from the reaction material supply part 2 (3) to the inside of the cavity 12 (13). Then the reaction material is regulated by the plurality of flow-regulating parts 7 (8), fills the small space above the plurality of flow-regulating parts 7 (8), then is guided to the main part of the cavity 12 (13), and fills the cavity 12 (13). Thereafter, the reaction material is guided from the reaction material discharge part 42 (43) to the reaction material ejection port 16 (17) via the passage 62 (63). Then, the reaction material is ejected from the reaction material ejection port 16 toward the upper surface of the substrate 23 via the reaction material opening 36 of the bottom plate 21.

(Exhaust Nozzle N4)

Next the configuration of the exhaust nozzle N4 will be described.

The exhaust nozzle N4 is a nozzle for performing exhaust processing. The exhaust nozzle N4 performs exhaust processing at a flow rate (Q4) equal to or larger than a sum of a flow rate (Q1) at which the raw material solution spray nozzle N1 ejects the raw material solution and a flow rate (Q2 and Q3) at which the reaction material spray nozzle N2 (N3) eject the reaction materials. That is, {exhaust flow rate Q4≥raw material solution ejection flow rate Q1 + reaction material ejection flow rate Q2 +Q3}.

A cavity 14 (third cavity) is formed inside the exhaust nozzle N4. Further, an exhaust material outlet 4 is provided in an upper surface of the exhaust nozzle N4. The exhaust material outlet 4 is provided in the upper surface of the exhaust nozzle N4, and specifically, the exhaust material outlet 4 is provided above an exhaust material introduction part 44 described later to discharge an exhaust material outside the exhaust nozzle N4 from the cavity 14.

Here, the exhaust material is a reaction residue and the like from the reaction space. The exhaust material outlet 4 is connected to an exhaust pump (not shown) via a path (not shown). That is, the exhaust is sucked from the exhaust nozzle N4 to the exhaust pump through the exhaust material outlet 4 and the above-mentioned path.

In addition, a plurality of flow-regulating parts 9 (third flow-regulating parts) are provided in the cavity 14 of the exhaust nozzle N4. The flow-regulating part 9 is a flow-regulating plate, and can mainly regulate the flow in the cavity 14 of the exhaust material to be discharged from the exhaust material outlet 4. Specifically, a plurality of flow-regulating parts 9 having a rectangular shape in plan view are arranged from the opposite side surfaces in the X-Y plane with alternately changing the formation heights in the cavity 14. Each of the plurality of flow-regulating parts 9 is configured so as to form a clearances with an opposite side surface without reaching the opposite side surface.

The plurality of flow-regulating parts 9 separate the cavity 14 of the exhaust nozzle N4 into a plurality of small spaces. Here, the small spaces which are adjacent to each other are connected via small clearances formed by the flow-regulating parts 9. The plurality of small spaces include a small space (of the cavity 14) located at an uppermost portion of the exhaust nozzle N4, and a lower portion of the plurality of flow-regulating parts 9 is a main part of the cavity 14. More, the small space above the plurality of flow-regulating parts 9 is connected to the exhaust material outlet 4, and (the main part of) the cavity 14 is connected to the exhaust material introduction part 44 described later.

The exhaust material introduction part 44 is provided in the other side surface portion in the cavity 14. Further, the exhaust material introduction part 44 is disposed at a position away from a bottom surface of the cavity 14 of the exhaust nozzle N4.

On the other hand, in the mist spray head 100, an exhaust port 18 is provided in the bottom surface of the mist spray head 100, that is, in the bottom surface of the reaction material spray nozzle N2. Here, the exhaust port 18 performs an exhaust processing on the reaction space.

In the mist spray head 100, a passage 64 is arranged along the Z direction. The exhaust material introduction part 44 is connected to the exhaust port 18 via a passage 64. As shown in FIG. 3, the exhaust port 18 assumes a slit shape which is an elongated opening hole whose longitudinal direction is a Y direction (first direction) in plan view. The width of the opening of the exhaust port 18 (dimension in the X direction in FIG. 3) is about 0.1 mm to 10 mm.

(Inert Gas Spray Part)

The inert gas spray part 81 is provided in a frame 30 or in a region adjacent to the frame 30 at the end of the mist spray head 100 of Embodiment 1 (end on the left (−X direction) side in FIG. 1).

Further, the mist spray head 100 is characterized in that in addition to the inert gas spray part 81, the inert gas spray part 82 and the inert gas spray part 83 are provided between the raw material solution spray nozzle N1 and the reaction material spray nozzle N3 and between the raw material solution spray nozzle N1 and the reaction material spray nozzle N2 respectively.

The inert gas spray part 81 is mainly composed of an inert gas supply part 51, a passage 71, and an inert gas ejection port 191, the inert gas spray part 82 is mainly composed of an inert gas supply part 52, a passage 72, and an inert gas ejection port 192 (second inert gas ejection port), and the inert gas spray part 83 is mainly composed of an inert gas supply part 53, a passage 73, and an inert gas ejection port 193 (first inert gas ejection port).

As shown in FIG. 2, in the inert gas spray part 82, the inert gas introduced from the outside into the inert gas supply parts 52 is guided to the inert gas ejection port 192 formed in the bottom surface of the mist spray head 100 (inert gas spray part 82) via the passage 72, and is ejected from the inert gas ejection port 192 via the inert gas opening 392 of the bottom plate 21. As with the inert gas supply parts 52, the inert gas supply parts 51 and 53 also eject the inert gas from the inert gas ejection ports 101 and 193 formed in the bottom surface of the mist spray head 100 (inert gas spray parts 81 and 83) via the passages 71 and 73 (in the inert gas ejection port 193, the inert gas is ejected via the inert gas opening 393 of the bottom plate 21). As the inert gas, nitrogen, argon, or the like can be considered.

The inert gas supply parts 51 to 53 communicate with the inert gas ejection ports 191 to 193, respectively, but the opening area of each of the inert gas supply parts 51 to 53 is desirably set to an area equal to or greater than the opening area of each of the inert gas ejection ports 191 to 193.

Furthermore, it is desired that the flow rate at which each of the inert gas ejection ports 191 to 193 ejects the inert gas is set to each of a flow rate at which the raw material solution ejection port 15 ejects the raw material solution and flow rates at which the reaction material ejection ports 16 and 17 eject the reaction material or less.

The inert gas spray parts 82 and 83 have the same overall configuration except for the forming position and the insert gas to be used.

Further, as shown in FIG. 2, inert gas introduced into the two inert gas supply parts 55 provided at both ends in the Y direction is ejected from two inert gas ejection ports 195 formed in the bottom surface of the mist spray head 100 via the passages 75 respectively.

As described above, the inert gas ejection port 195 is provided in the frame 30 or in the region adjacent to the frame 30 described above.

With the above-described configuration, the inert gas sent from the outside of the mist spray head 100 through the inert gas supply parts 51 to 53 of the inert gas spray parts 81 to 83 and the inert gas supply part 55 is supplied into the mist spray head 100. The passages 71 to 73 and the passage 75 are provided in the mist spray head 100, and the supplied inert as propagates through the passages 71 to 73 and the passage 75. The inert gas ejection ports 191 to 193 and the inert gas ejection port 195 are provided in the bottom surface (side facing the substrate 23) of the mist spray head 100, and the inert gas is sprayed from the inert gas ejection ports 191 to 193 and the inert gas ejection port 195 toward the upper surface of the substrate 23.

FIG. 4A and 4B are explanatory views showing the appearance structure and the like of the base plate 20 in a state in which the bottom plate 21 is removed, as viewed from the Y direction. FIG. 4A is a side view of the mist spray head 100 as viewed from the left side surface (−X direction), and FIG. 4B is a front view as viewed from the front (+Y direction). The cross sectional structure taken along line B-B of FIG. 4A is a sectional view shown in FIG. 1.

As described above, the exhaust nozzle N4 is disposed separately from the other nozzles N1 to N3 in the X direction. Accordingly, an open ceiling part 58 is generated between the exhaust nozzle N4 and the other nozzles N1 to N3. Thus, the mist spray head 100 includes the base plate 20. The base plate 20 covers the open ceiling part 58 from a side where the substrate 23 is disposed (refer to FIG. 1, FIG. 3, and FIG. 4B). The exhaust nozzle N4 is provided on the upper surface of the base plate 20.

As shown in FIG. 1, FIG. 3, and FIG. 4B, an inert gas supply part 54 (refer to FIG. 4B, a passage 74 (refer to FIG. 1 and FIG. 3), and a plurality of inert gas ejection ports 194 (third inert gas ejection ports) are provided in the base plate 20 of the mist spray head 100 of Embodiment 1.

In the base plate 20, the inert gas sent from the outside of the mist spray head 100 via the inert gas supply part 54 is supplied to the base plate 20. The passage 74 is provided in the base plate 20, and the supplied inert gas propagates in the passage 74. The plurality of inert gas ejection ports 194 are provided in the bottom surface (side facing the substrate 23) of the base plate 20, and the inert gas is sprayed from the plurality of inert gas ejection ports 194 toward the upper surface of the substrate 23 via the inert gas opening 394 of the bottom plate 21, As shown in FIG. 3, each of the inert gas ejection ports 191 to 194 has a slit shape which is an elongated opening hole whose longitudinal direction is a Y direction (first direction) in plan view. On the other hand, the inert gas ejection port 195 has a slit shape which is an elongated opening hole whose longitudinal direction is the X direction (second direction) in plan view. The widths of the openings of the inert gas ejection ports 191 to 195 (the dimension in the X direction in FIG. 3 with the inert gas ejection ports 191 to 194, and the dimension in the Y direction in FIG. 3 with the inert gas ejection port 195) is about 0.1 mm to 10 mm.

Therefore, the inert gas ejection port 192 (second inert gas ejection port) is provided between the raw material solution ejection port 15 and the reaction material ejection port 17 (second reaction material ejection port), and an inert gas ejection port 193 (first inert gas ejection port) is provided between the raw material solution ejection port 15 and the reaction material ejection port 16 (first reaction material ejection port). That is, in the mist spray head 100 of Embodiment 1, it is characterized that the inert gas ejection ports 193 and 192 are provided between the raw material solution ejection port 15 and the reaction material ejection ports 16 and 17, respectively.

Further, in the base plate 20 of Embodiment 1 shown in FIG. 1 and Fig. 4B, a temperature adjustment mechanism 22 is disposed. The temperature adjustment mechanism 22 can adjust the temperature in the base plate 20. Specifically, this is realized by providing a coolant and a heater in a hole portion constituting the temperature adjustment mechanism 22.

As shown in FIG. 1 and FIG. 3, the reaction material ejection port 17, the raw material solution ejection port 15, the reaction material ejection port 16, and the exhaust port 18 are arranged in this order in the X direction. Although different from the drawing, the reaction material ejection port 16, the raw material solution ejection port 15, the reaction material ejection port 17, and the exhaust port 18 may be arranged in this order in the X direction.

As described above, in the mist spray head 100 of Embodiment 1, the bottom surface of the raw material solution spray nozzle N1, the bottom surfaces of the reaction material ejection nozzles N2 and N3, and the bottom surface of the base plate 20 are configured so as to be flush. Accordingly, the raw material solution ejection port 15, the reaction material ejection ports 16 and 17, and the inert gas ejection ports 192 to 194 are provided in a flush bottom surface of the mist spray head 100.

Referring to FIG. 3, the mist spray head 100 has a frame 30 of the mist spray head 100 on a side (bottom surface) facing substrate 23. The frame 30 is a portion close to the edge of the bottom surface of the mist spray head 100 and is a portion which is bordered so as to surround the bottom inside surface of the mist spray head 100 from the surroundings. As is apparent from FIG. 1, the frame 31) protrudes from the bottom surface of the bottom plate 21 toward the substrate 23 side. The protrusion length is set to, for example, the range from 0.1 to 10 mm.

That is, the reaction space is surrounded by the frame 30. However, the end of the frame 30 and the upper surface of the substrate 23 are not in contact with each other.

When the atomized raw material solution and two reaction materials are sprayed into the reaction space from the raw material solution ejection port 15 and the reaction material ejection ports 16 and 17 of the mist spray head 100 via the bottom plate 21, the raw material solution and the two reaction materials react on the heated substrate 23, and a desired film is formed on the upper surface of the substrate 23. The reaction residues and the like in the reaction space are excluded from the reaction space by the exhaust nozzle N4.

In addition, in the mist spray head 100 of Embodiment 1, as with the base plate 20, the temperature adjustment mechanism 22 is disposed in each of the raw material solution spray nozzle N1 and the reaction material spray nozzles N2, N3.

(Bottom Plate 21)

The film forming device according to Embodiment 1 is characterized by including a bottom plate 21 detachably provided on the bottom surface of the mist spray head 100. At this time, the bottom plate 21 is attached to the bottom surface of the mist spray head 100 in the form of not disturbing the execution of the film forming processing by the film forming device.

In addition, a thickness of the bottom plate 21 is set to, for example, about 1.0 to 1.5 mm and attachment of the bottom plate 21 to the bottom surface of the mist spray head 100 may be screw fastening or the like.

Specifically, as shown in FIG. 1, the bottom plate 21 includes the raw material solution opening 35, the reaction material openings 36 and 37, and the inert gas openings 392 to 394 in the regions corresponding to the raw material solution ejection port 15, the reaction material ejection ports 16 and 17, and the inert gas ejection ports 192 to 194 when the bottom plate 21 is attached to the bottom surface of the mist spray head 100.

The raw material solution opening 35 is formed, in a region corresponding to the raw material solution ejection port 15, in a slit shape which is an elongated opening hole whose longitudinal direction is the Y direction (first direction) in plan view. That is, the raw material solution opening 35 is formed in the same shape that coincides with a shape of the raw material solution ejection port 15 in a plan view when attaching the bottom plate 21.

The reaction material openings 36 and 37 are each formed, in regions corresponding to the reaction material ejection ports 16 and 17. In a slit shape which is an elongated opening hole whose longitudinal direction is the Y direction (first direction) in a plan view. That is, the reaction material openings 36 and 37 are formed in the same shapes that coincide with shapes of the reaction material ejection ports 16 and 17, respectively, in a plan view when attaching the bottom plate 21.

The inert gas openings 392 to 394 are each formed, in regions corresponding to the inert gas ejection ports 192 to 194, in a slit shape which is an elongated opening hole whose longitudinal direction is the Y direction (first direction) in a plan view. That is, the inert gas openings 392 to 394 are formed in the same shapes that coincide with shapes of the inert gas ejection ports 192 to 194, respectively, in a plan view when attaching the bottom plate 21.

Accordingly, the bottom plate 21 has no effect on the film forming processing by the film forming device of Embodiment 1 regarding the raw material solution ejection port 15, the reaction material ejection ports 16 and 17, and the inert gas ejection ports 192 to 194 when the bottom plate 21 is attached.

Since the exhaust port 18 and the inert gas ejection ports 191 and 195 are provided on the outermost side of the mist spray head 100, the bottom plate 21 is disposed in the vicinity of the exhaust port 18 and the like without covering the exhaust port 18, the inert gas ejection ports 191 and 195 when the bottom plate 21 is attached to the bottom surface of the mist spray head 100.

Accordingly, the bottom plate 21 has no effect on the film forming processing by the film forming device of Embodiment 1 regarding the exhaust port 18 and the inert gas ejection ports 191 and 195 when the bottom plate 21 is attached.

As described above, when attaching the bottom plate 21 to the bottom surface of the mist spray head 100, in the frame 30 of the bottom surface of the mist spray head 100 shown in FIG. 3, the bottom plate 21 is disposed from the vicinity of the exhaust port 18 to the vicinity of the inert gas ejection port 191 without covering the exhaust port 18 and the inert gas ejection port 191.

Therefore, the bottom plate 21 can be attached to the bottom surface of the mist spray head 100 in the form of not disturbing the execution of the film forming processing by the film forming device.

Further, the bottom plate 21 is made of a material having corrosion resistance. Specifically, the bottom plate 21 is made of stainless steel or a material coated with a corrosion-resistant and heat-resistant coating such as an alumite or a fluorine-based resin.

(Effect etc.)

The film forming device of Embodiment 1 can easily remove the reaction products adhering to the bottom plate 21 by disposing the detachable bottom plate 21 on the bottom surface of the mist spray head 100 and washing the bottom plate 21 after removing the bottom plate 21.

Furthermore, it is possible to keep on using a film forming device while cleaning one bottom plate by preparing a plurality of bottom plates 21 in advance, and using another washed bottom plate while one bottom plate among the plurality of bottom plates 21 is cleaned.

Furthermore, the film forming device of Embodiment 1 can easily remove the reaction products adhering to the bottom plate 21 without disturbing film forming processing at the time of attaching the bottom plate 21 by providing the raw material solution opening 35, the reaction material openings 36 and 37, and the inert gas openings 392 to 394 in the bottom plate 21.

Since the bottom plate 21 is disposed without covering the exhaust port 18 and the inert gas ejection ports 191 and 195, when the bottom plate 21 is attached to the bottom surface of the mist spray head 100, the exhaust processing is not affected when the bottom plate 21 is attached.

In addition, the raw material solution ejection port 15, the reaction material ejection ports 16 and 17, and the inert gas ejection ports 191 to 194 formed in the bottom surface of the mist spray head 100 of Embodiment 1 are formed in a slit shape in which a first direction (Y direction) is a longitudinal direction. The raw material solution opening 35, reaction material openings 36 and 37, and inert gas openings 392 to 394 in the bottom plate 21 are formed in the same shapes which coincide with shapes of the raw material solution ejection port 15, the reaction material ejection ports 16 and 17, and the inert gas ejection ports 192 to 194, respectively, in a plan view when the bottom plate 21 is attached to the bottom surface of the mist spray head 100. Therefore, it is possible to evenly spray the atomized raw material solution to the large-area substrate 23.

Further, the mounting part 24 or the mist spray head 100 is movable in the horizontal direction. Therefore, the film forming processing using the film forming device (mist spray head 100) according to the present embodiment can be performed on an entire surface of the substrate 23 having the large surface area.

A uniformly atomized raw material solution or the like can be sprayed to the upper surface of the substrate 23, for example, by performing the film forming processing by the film forming device while moving the mist spray head 100 in the X direction.

Further, by forming the reaction material ejection port 16 (17) in a slit shape, the reaction material can be sprayed evenly to the upper surface of the large-area substrate 23.

In addition, by forming the exhaust port 18 in a slit shape, the exhaust processing can be performed over a wider range. Further, it is possible to equalize the flow in the X direction in which the raw material solution or the like flows toward the exhaust port 18.

Further, composing the bottom plate 21 of a material having corrosion resistance can facilitate the reuse of the bottom plate 21 after the cleaning process.

In addition, in the mist spray head 100 of Embodiment 1, the inert gas spray part 83 (first inert gas spray part) is provided between the raw material solution spray nozzle unit N1 and the reaction material spray nozzle N2, and the inert gas spray part 82 (second inert gas spray part) is provided between the raw material solution ejection port 15 and the reaction material spray nozzle N3.

The mist spray head 100 of Embodiment 1 having the above configuration is characterized in that by combining the raw material solution spray nozzle N1, the reaction material spray nozzles N2 and N3, and the inert gas spray parts 82 and 83, the inert gas ejection ports 193 and 192 are provided between the raw material solution ejection port 15 and the reaction material ejection ports 16 and 17, respectively.

Therefore, in the film forming device of Embodiment 1 by ejecting the inert gas from the inert gas ejection ports 192 and 193 via the bottom plate 21, it is possible to reduce the adhesion of reaction products to each of the vicinity of the raw material solution opening 35 and vicinities of the reaction material openings 36 and 37 of the bottom plate 21. As a result, the film forming device of Embodiment 1 achieves the effect that cleaning of the bottom plate 21 can be performed more easily.

Further, in the film forming device of Embodiment 1, by setting the opening area of each of the inert gas supply parts 51 to 53 to an area equal to or greater than the opening area of each of the inert gas ejection ports 191 to 193, that is, by setting the opening area of each of the inert gas ejection ports 191 to 193 to an area equal to or less than the opening area of each of the inert gas supply parts 51 to 53, the effect that a pressure difference can be set between the inert gas ejection port 191 or the like and the inert gas supply part 51 and the inert gas can be uniformly spread over the upper surface of the substrate 23 at the time of film formation, is achieved.

In addition, in the film forming device of Embodiment 1, the flow rate at which each of the inert gas ejection ports 192 and 193 ejects the inert gas is set to a flow rate equal to or less than each of a flow rate at which the raw material solution ejection port 15 ejects the raw material solution and flow rates at which the reaction material ejection ports 16 and 17 eject the reaction material.

Therefore, the film forming device of Embodiment 1 can suppress the phenomenon of impairing the reaction between the raw material solution and the reaction material by ejecting the inert gas.

Further, the mist spray head 100 of the film forming device according to Embodiment 1 has the raw material solution spray nozzle N1. The raw material solution spray nozzle N1 is provided with, in the cavity 11, the raw material solution discharge part 41 provided in the one side surface side at a position away from the bottom surface of the cavity 11.

Accordingly, even if the raw material solution reacts with the residual moisture in the cavity 11 in the raw material solution spray nozzle N1 to produce particles, the particles are trapped in the region from the bottom surface to the raw material solution discharge part 41 in the cavity 11. That is, the region in the cavity 11 functions as a particle trap, and particles are captured in the region and can be prevented from being transported to the raw material solution discharge part 41, the passage 61, and the raw material solution ejection port 15. Therefore, it is also possible to prevent particles from adhering and causing clogging in the parts 41, 61, 15 (35).

Although, differing from the above configuration, the installation of the plurality of flow-regulating parts 6 may be omitted, a plurality of flow-regulating parts 6 are disposed in the cavity 11 in the raw material solution spray nozzle N1.

Therefore, the flow of the atomized raw material solution in the cavity 11 can be regulated, which makes it more reliable to capture the particles in the region functioning as a particle trap.

In addition, the side surface portion to which the lowermost flow-regulating part 6 among the plurality of flow-regulating parts 6 is attached and the side surface in which the raw material solution discharge part 41 is provided are the same (both of the side surface portions are provided on the one side surface portion (left side)). Thus, droplets or the like can also be prevented from running down the one side surface portion and flowing into the raw material solution discharge part 41.

Although, differing from the above configuration, the installation of the reaction material spray nozzles N2 and N3 may be omitted, the mist spray head 100 has the reaction material spray nozzles N2 and N3. Accordingly, the reaction can be promoted in the film forming processing in the atmosphere. Also, a wide variety of films can be formed.

Furthermore, the mist spray head 100 of Embodiment 1 has two reaction material spray nozzles N2, N3. Herein, the raw material solution spray nozzle N1 is laterally sandwiched between the reaction material spray nozzle N2 (first reaction material spray nozzle) and the reaction material spray nozzle N3 (second reaction material spray nozzle).

Accordingly, different reaction materials can be ejected to the reaction space. Therefore, various types of films can be formed on the substrate 23. In addition, when the same reaction material is ejected from the reaction material spray nozzles N2, N3, a speed of forming the desired film on the substrate 23 can be enhanced.

Further, each of the reaction material spray nozzles N2, N3 has a temperature adjustment mechanism 22. Accordingly, for example, a liquid drop accumulating in the reaction material spray nozzles N2, N3 can be evaporated. Therefore, the evaporated reaction material can be used as a reaction material to be sprayed from the reaction material spray nozzles N2, N3.

In addition, the temperature adjustment mechanism 22 is also disposed in the raw material solution spray nozzle N1. Therefore, the raw material solution, for example, can be kept in a mist state. That is, it can be prevented that the droplet of the raw material solution sprayed from the raw material solution spray nozzle N1 becomes large and then the raw material solution which becomes a large liquid drop drops on the upper surface of the substrate 23.

Further, a plurality of inert gas ejection ports 194 (third inert gas ejection ports) which spray the inert gas to the substrate 23 are provided in the bottom surface of the base plate 20. Accordingly, the raw material solution or the like existing under the base plate 20 can be pressed against the upper surface of the substrate 23. Therefore, the utilization efficiency of the raw material solution and the like can be enhanced.

Further, the base plate 20 has the temperature adjustment mechanism 22. Therefore, the raw material solution and the like can be kept in a mist state in the reaction space. In addition, adhesion of liquid droplets to the base plate 20 can be prevented. Furthermore, a film forming reaction on the substrate 23 can be promoted.

The inert gas ejection ports 191, 195 which spray the inactive gas to the substrate 23 are provided in the frame 30 of the mist spray head 100 or in the vicinity of the frame 30. Therefore, the reaction space can be surrounded with the inert gas, so that the diffusion of the raw material solution or the like from the reaction space can be suppressed.

Further, the reaction material spray nozzle N2 (N3) is provided with, in the cavity 12 (13), the reaction material discharge part 42 (43) provided on the one side surface side at a position away from the bottom surface of the cavity 12.

Therefore, even if the reaction material reacts with the atmosphere in the cavity 12 (13) in the reaction material spray nozzle N2 (N3) to produce particles, the particles are trapped in the region from the bottom surface to the reaction material discharge part 42 (43) in the cavity 12. That is, the region in the cavity 12 (13) functions as a particle trap, and particles are captured in the region and can be prevented from being transported to the reaction material discharge part 42 (43), the passage 62 (63), and the reaction material ejection port 16 (17). Therefore, it is possible to prevent particles from adhering and clogging in the parts 42, 62, 16 (36) (43, 63, 17 (37)).

Although, differing from the above configuration, the installation of the plurality of flow-regulating parts 7 may be omitted, a plurality of flow-regulating parts 7 (8) are disposed in the cavity 12 (13) in the reaction material spray nozzle section N2 (N3).

Therefore, the flow of the reaction material in the cavity 12 (13) can be regulated, which makes it more reliable to capture the particles in the region functioning as a particle trap. In addition, in the cavity 12, the side surface portion to which the lowermost flow-regulating part 7 (8) among the plurality of flow-regulating parts 7 (8) is attached and the side surface in which the reaction material discharge part 42 (43) is provided are the same (both of the side surface portions are provided on the one side surface portion (side surface on a left side)). Thus, droplets or the like can also be prevented from running down the one side surface portion and flowing into the reaction material discharge part 42 (43).

Although, differing from the above configuration, the installation of the exhaust nozzle N4 may be omitted, the mist spray head 100 has the exhaust nozzle N4. Therefore, the flow of the raw material solution and the reaction material moving to the exhaust nozzle N4 can be generated. Thus, a turbulence in the flow of the raw material solution or the like in the reaction space can be prevented, so that a film quality of the film to be formed can be improved. In addition, the diffusion of the raw material solution or the like outside the reaction space can be suppressed.

Further, in the exhaust processing, the flow rate is controlled so as to satisfy {exhaust flow rate Q4≥raw material solution ejection flow rate Q1+reaction material ejection flow rate Q2+Q3}. Therefore, the raw material solution and the two reaction materials sprayed to the inside of the reaction space can make the flow in the reaction space more reliable. In addition, the raw material solution and the two reaction materials can be prevented reliably from diffusing outward from the reaction space.

In addition, the reaction material spray nozzle N3, the raw material solution spray nozzle N1, the reaction material spray nozzle N2, and the exhaust nozzle N4 are arranged side by side in the X direction (horizontal direction), and at least the exhaust nozzle N4 is located on an outermost side of the mist spray head 100.

Accordingly, the raw material solution and the two reaction material moves to the outermost side of the mist spray head 100 in the reaction space. Therefore, a region where the raw material solution and the reaction material contact the substrate 23 is maximized, so that a generation of an unreacted raw material solution in the reaction space can be minimized.

The exhaust nozzle N4 is provided with, in the cavity 14, the exhaust material introduction part 44 provided on the other side surface side at a position away from the bottom surface of the cavity 14.

Therefore, the exhaust material taken into the cavity 14 from the exhaust material introduction part 44 is trapped in the region from the bottom surface to the exhaust material introduction part 44 in the cavity 14. That is, the region in the cavity 14 functions as a particle trap, and an exhaust material having a large particle size is captured in the region and can be prevented from flowing in advance of the exhaust material outlet 4. Thus, the lifetime of the filter disposed in the exhaust pump can be prolonged.

Although, differing from the above configuration, the installation of the plurality of flow-regulating parts 9 may be omitted, a plurality of flow-regulating parts 9 are disposed in the cavity 14 in the exhaust nozzle N4.

Therefore, the exhaust material having a large particle size can be more reliably prevented from flowing in advance of the exhaust material outlet 4. Thus, the lifetime of the filter disposed in the exhaust pump can be extended.

Further, the mist spray head 100 has a base plate 20 for covering the open ceiling part 38 from the substrate 23 side.

Accordingly, even if the exhaust nozzle N4 is disposed separately from the other nozzles N1 to N3, it is possible to prevent the raw material solution or the like from flowing from the reaction space to the open ceiling part 58. Further, it is easy to assemble the exhaust nozzle N4 and the other nozzles N1 to N3 in the mist spray head 100.

Further, a frame 30 of the mist spray head 100 protrudes toward the substrate 23 side. Therefore, the reaction space can be surrounded, and the diffusion of the raw material solution and the like from the reaction space can be suppressed.

Embodiment 2

Figure 5:
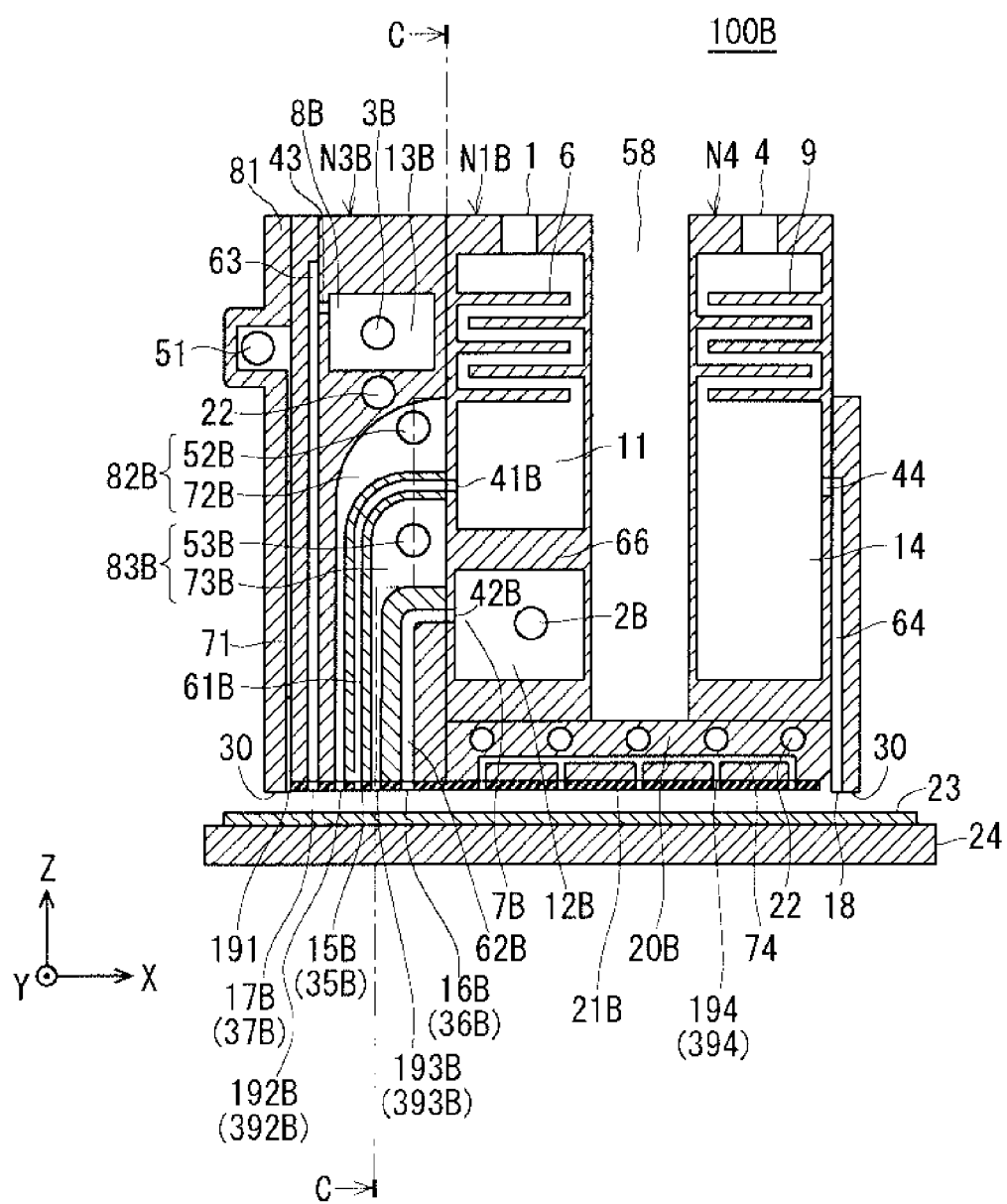
FIG. 5 is a cross sectional view showing a mist spray head of a film forming device according to Embodiment 2 of the present invention.

FIG. 5 is a cross sectional view showing a configuration of the mist spray head 100B in the film forming device according to Embodiment 2. FIG. 6 is a cross sectional view showing a cross sectional structure taken along line C-C of FIG. 5. Also, in FIG. 6, illustration of the bottom plate 21B is omitted.

Figure 8A:
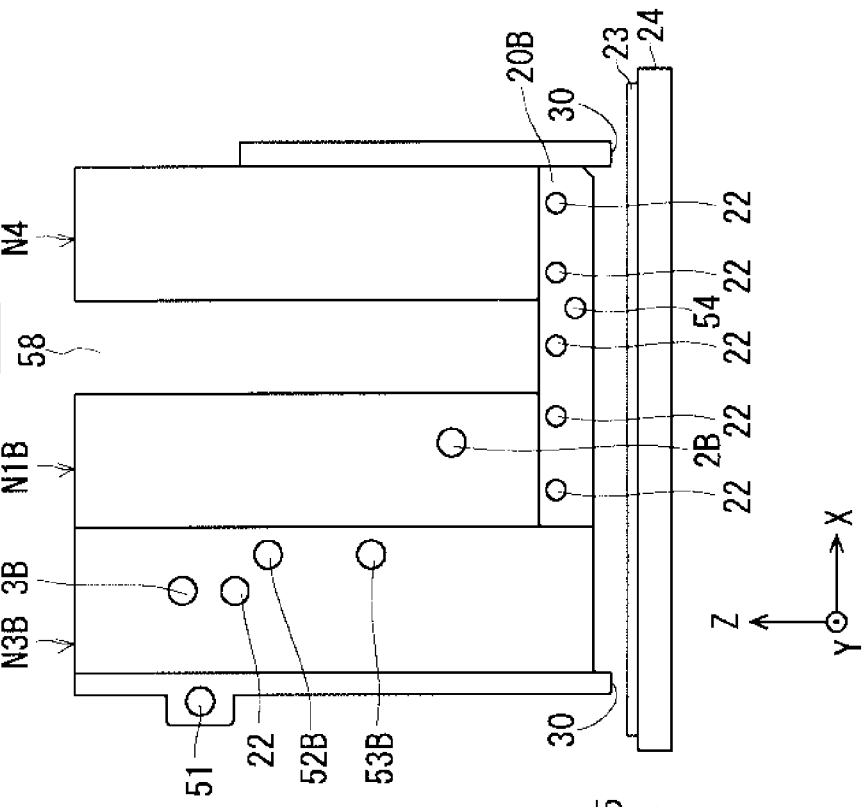
FIGS. 8A and 8B are explanatory views showing an appearance structure and the like of a base plate of Embodiment 2.
Figure 8B:
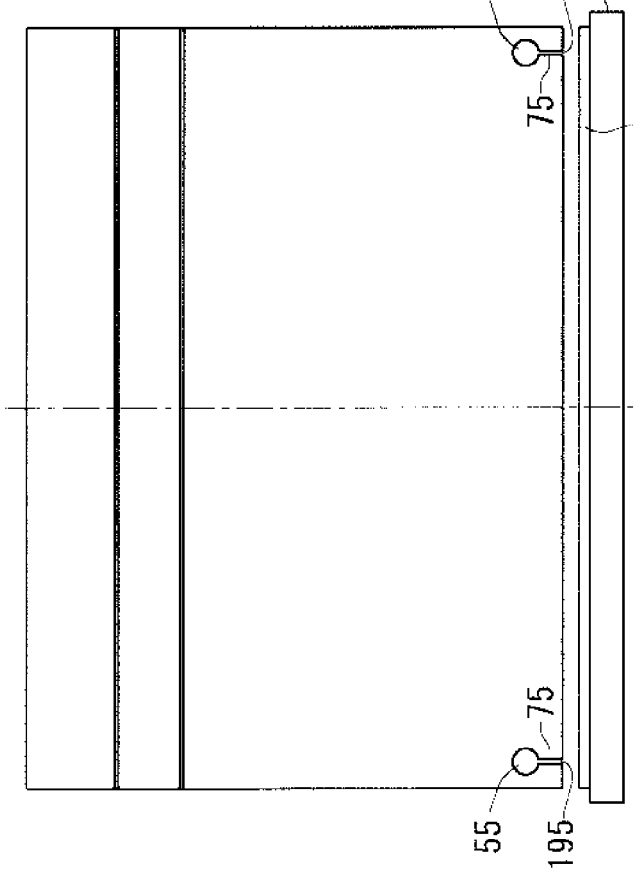

FIG. 7 is a plan view showing the bottom structure of the mist spray head 100B in a state in which the bottom plate 21B is removed. FIG. 8A and FIG. 8B are explanatory views showing the appearance structure and the like of the base plate 20B in a state in which the bottom plate 21B is removed, as viewed from the Y direction. FIG. 8A is a side view of the mist spray head 100B as viewed from the left side surface (-X direction), and Fig. 8B is a front view as viewed from the front (+Y direction). The cross sectional structure taken along line D-D of Fig. 8A is a sectional view shown in FIG. 5.

The mist spray head 100 according to embodiment 1 includes two reaction material spray nozzles N2, N3. On the other hand, in the mist spray head 100B according to Embodiment 2, a configuration is realized in which the reaction material spray nozzle N3B is unified, and the first and second reaction materials are ejected from the reaction material ejection ports 16B and 17B provided in the bottom surface of the reaction material spray nozzle N3B. Furthermore, a configuration is realized in which the atomized raw material solution is ejected from the raw material solution ejection port 15B provided in the bottom surface of the reaction material spray nozzle N3B. In the film forming device of Embodiment 2, a bottom plate 21B is attached to the bottom surface of the mist spray head 100B in place of the bottom plate 21.

The mist spray head 100 of Embodiment 1 and the mist spray head 100B of Embodiment 2 are mainly different in that the reaction material spray nozzles N2 and N3 are replaced with the reaction material spray nozzle N3B and that the raw material solution spray nozzle N1 is replaced with the raw material solution spray nozzle N1B. In the following description, with respect to the mist spray head 100B of Embodiment 2, the description will focus mainly on the components different from those of the mist spray head 100 of Embodiment 1, and the same components as those in Embodiment 1 are denoted by the same reference numerals, and the explanation will be omitted as appropriate.

As shown in FIG. 5, the mist spray head 100B has the reaction material spray nozzle N3B, the raw material solution spray nozzle N1B, and an exhaust nozzle N4. As shown in FIG. 5, the reaction material spray nozzle N3B, the raw material solution spray nozzle N1B, and the exhaust nozzle N4 are disposed side by side in this order along the X direction (horizontal direction).

Further, the side surface of the raw material solution spray nozzle N1B is in contact with the side surface of the reaction material spray nozzle N3B. However, the side surface of the raw material solution spray nozzle N1B and the side surface of the exhaust nozzle N4 are separated by a predetermined distance. That is, the reaction material spray nozzle N3B and the raw material solution spray nozzle N1B are adjacent to each other in the X direction, and the exhaust nozzle N4 is disposed separately from other nozzles N1B N3B in the X direction.

As described above, the reaction material spray nozzle N3B, the raw material solution spray nozzle N1B, and the exhaust nozzle N4 are arranged side by side in the X direction (horizontal direction). Here, at least the exhaust nozzle N4 is located at the outermost side (the right end (+X direction) in FIG. 5) of the mist spray head 100B.

The mist spray head 100B sprays the atomized raw material solution or the like to the upper surface of the substrate 23 which is heated at a predetermined temperature by the mounting part 24. Thereby, a desired film is formed on the upper surface of the substrate 23. The mounting part 24 moves in a horizontal direction (in an X-Y plane) at the time of film forming processing. Alternatively, the mist spray head 100B moves in the horizontal direction.

(Raw Material Solution Spray Nozzle N1B and Reaction Material Spray Nozzle N3B)

Hereinafter, configurations of the raw material solution spray nozzle N1B and the reaction material spray nozzle N3B will be described.

The raw material solution spray nozzle N1B is a nozzle for spraying the atomized raw material solution from the raw material solution ejection port 15B formed on the bottom surface of the reaction material spray nozzle N3B via the raw material solution opening 35B of the bottom plate 21B. A cavity 11 (one cavity) and a cavity 12B (the other cavity) are formed in the raw material solution spray nozzle N1B. The raw material solution supply part 1 is disposed on the upper surface of the raw material solution spray nozzle N1B as with the raw material solution spray nozzle N1 of Embodiment 1.

In addition, a plurality of flow-regulating parts 6 (first flow-regulating part) are provided on both side surface portions in the cavity 11 of the raw material solution spray nozzle N1B, as with the raw material solution spray nozzle N1 of Embodiment 1.

A cavity 11 is provided below the plurality of flow-regulating parts 6. A small space above the plurality of flow-regulating parts 6 is connected to the cavity 11 through a clearance formed by the plurality of the flow-regulating parts 6, and the cavity 11 is connected to the raw material solution discharge part 41B.

The raw material solution discharge part 41B is provided in one side surface portion (side surface on the left (−direction) side in Fig. 1 in the cavity 11. Further, the raw material solution discharge part 41B is disposed at a position away from a bottom surface of the raw material solution spray nozzle N1B (cavity 11).

On the other hand, a raw material solution ejection port 15B is formed in the bottom surface of the reaction material spray nozzle portion N3B instead of the raw material solution spray nozzle N1B. That is, in the mist spray head 100B of Embodiment 2 the atomized raw material solution is ejected from the raw material solution ejection port 15B provided in the bottom surface of the reaction material spray nozzle N3B to the upper surface of the substrate 23 via the raw material solution opening 35B of the bottom plate 21B.

Then, a passage 61B (first internal passage) is provided inside the reaction material spray nozzle N3. The raw material solution discharge part 41B provided in the raw material solution spray nozzle N1B is connected to the raw material solution ejection port 15B via a passage 61B provided in the reaction material spray nozzle N1B.

As shown in FIG. 7, the bottom surface of the mist spray head 100B assumes a rectangular shape defined by the X direction (second direction) and the Y direction (first direction). Then, the raw material solution ejection port 15B assumes a slit shape which is an elongated opening whose longitudinal direction is the Y direction (first direction) in plan view. The width of the opening of the raw material solution ejection port 15B (dimension in the X direction in FIG. 7) is about 0.1 mm to 10 mm.

In the raw material solution spray nozzle N1B, the atomized raw material solution is supplied from the raw material solution supply part 1 to the inside of the cavity 11. Then, the raw material solution is regulated by the plurality of flow-regulating parts 6, fills the small space above the plurality of flow-regulating parts 6, then is guided to the cavity 11, and fills the cavity 11. Thereafter, the atomized raw material solution is guided from the raw material solution discharge part 41B to the raw material solution ejection port 15B via the passage 61B of the reaction material spray nozzle N3B. The atomized raw material solution is ejected from the raw material solution ejection port 15B toward the upper surface of the substrate 23 via the raw material solution opening 35B of the bottom plate 21B.

Furthermore, the raw material solution spray nozzle N1B has a cavity 12B below the cavity 11, and as shown in FIGS. 5 and 8B, the cavity 12B is connected to a reaction material supply part 2B for supplying a first reaction material contributing to the reaction with the raw material solution, and the cavity 12B is connected to a reaction material discharge part 42B described later.

The reaction material discharge part 42B (first reaction material discharge part) is provided in one side surface portion (side surface on the left (-X direction) side in Fig. 5 in the cavity 12B. Further, the reaction material discharge part 42B is disposed at a position away from a bottom surface of the raw material solution spray nozzle N1B (cavity 12B).

On the other hand, a passage 62B (second internal passage) is provided in the reaction material spray nozzle N3B. Then, the reaction material discharge part 42B provided in the raw material solution spray nozzle N1B is connected to the reaction material ejection port 16B (first reaction material ejection port) provided in the bottom surface of the reaction material spray nozzle N3B via a passage 62B provided in the reaction material spray nozzle N3B.

On the other hand, the reaction material spray nozzle N3B is a nozzle which ejects the second reaction material mainly contributing to the reaction with the raw material solution to the substrate 23. In the reaction material spray nozzle N3B, a single cavity 13B is formed. As shown in FIG. 5, the cavity 13B is provided at an upper portion (in the +Z direction) in the reaction material spray nozzle N3B. Specifically, the cavity 13B is provided on the upper side in the reaction material spray nozzle N3B. Here, the cavity 13B is a space formed independently from other spaces.

As shown in FIG. 5 and Fig. 8B, the reaction material supply part 3B is provided in the side surface in the Y direction in the cavity 13B. The second reaction material is supplied from the outside of the reaction material spray nozzle N3B to the inside of the cavity 13B via the reaction material supply part 3B.

Here, the above-mentioned first and second reaction materials may be gas or liquid. In the case of a liquid, the liquid (reaction material) atomized by using ultrasonic vibration or the like is transported into the raw material solution spray nozzle N1B or the reaction material spray nozzle N3B through a path not shown together with the carrier gas.

The second reaction material output from the reaction material supply part 3B fills (is supplied to) the cavity 13B in the reaction material spray nozzle N3B.

Although not shown in FIG. 5, in the cavity 12B of the raw material solution spray nozzle N1B and in the cavity 13B of the reaction material spray nozzle N3B, flow-regulating part having a function/action (that is, a function action of promoting that the flow of the reaction material in the cavities 12B, 13B is regulated, and even if the reaction material and the atmosphere react to produce particles, the particles are trapped in the region from the bottom surface of the cavities 12B, 13B to the reaction material discharge part 42B, 43B) described in Embodiment 1 may be provided.

A reaction material discharge part 43 is provided in the side surface in the X direction in the cavity 13B. Here, the reaction material discharge part 43 is disposed at a position away from a bottom surface of the cavity 13B.

Reaction material ejection ports 16B and 17B are provided in the bottom surface of the reaction material spray nozzle N3B. Here, the first reaction material supplied from the cavity 12B is ejected from the reaction material ejection port 16B to the upper surface of the substrate 23 via the reaction material opening 36B of the bottom plate 21B, and the second reaction material supplied from the cavity 13B is ejected from the reaction material ejection port 17B to the upper surface of the substrate 23 via the reaction material opening 37B of the bottom plate 21B.

A passage 62B and a passage 63 are provided in the mist spray head 100B (reaction material spray nozzle N3B in the configuration example of FIG. 5). By a neighboring arrangement of the raw material solution spray nozzle N1B and the reaction material spray nozzle N3B, the reaction material discharge part 42B is connected to the reaction material ejection port 16B via the passage 62B. On the other hand, in the reaction material spray nozzle N3B, the reaction material discharge part 43B is connected to the reaction material ejection port 17B via the passage 63.

Further, as shown in FIG. 5 a raw material solution ejection port 15B which ejects the raw material solution to the substrate 23 is provided in the bottom surface of the reaction material spray nozzle N3B. In Embodiment 2, the passage 61B connected between the raw material solution discharge part 41B and the raw material solution ejection port 15B is provided in the reaction material spray nozzle N3B.

Therefore, in the mist spray head 100B of Embodiment 2, the reaction material ejection port 17B, the raw material solution ejection port 15B, and the reaction material ejection port 16B are provided in this order in the X direction (horizontal direction) on the side of the reaction material spray nozzle N3B facing the substrate 23. Here, as shown in FIG. 7, each of reaction material ejection ports 17B, 16B and the raw material solution ejection port 15B assumes a slit shape which is an elongated opening hole whose longitudinal direction is the Y direction in plan view. The widths of the openings of the reaction material ejection ports 17B, 16B and the raw material solution ejection port 15B (dimension in the X direction in FIG. 7) are about 0.1 mm to 10 mm.

The reaction material (first reaction material) discharged from the raw material solution spray nozzle N1B is supplied from the reaction material supply part 2B to the inside of the cavity 12B in the raw material solution spray nozzle N1B. Then, after filling the cavity 12B, the first reaction material is discharged from the reaction material discharge part 42B to the reaction material spray nozzle N3B. Thereafter, the first reaction material is guided to the reaction material ejection port 16B provided in the bottom surface of the reaction material spray nozzle N3B via the passage 62B in the reaction material spray nozzle N3B. Then, the first reaction material is ejected from the reaction material ejection port 16B toward the upper surface of the substrate 23 via the reaction material opening 36B of the bottom plate 21B.

On the other hand, the reaction material (second reaction material) is supplied to the inside of the cavity 13B from the reaction material supply part 3B in the reaction material spray nozzle N3B. Then, after filling the cavity 13B, the second reaction material is guided from the reaction material discharge part 43 to the reaction material ejection port 17B via the passage 63.

As shown in FIGS. 5 and 7, the reaction material ejection port 17B, the raw material solution ejection port 15B, the reaction material ejection port 16B, and the exhaust port 18 are arranged in this order in the X direction (horizontal direction).

The exhaust nozzle N4 is disposed separately from the other nozzles N3B, N1B in the X direction. Accordingly, an open ceiling part 58 is generated between the exhaust nozzle N4 and the other nozzles N3B, N1B. Therefore, also in the present embodiment, the mist spray head 100B includes the base plate 20B. The base plate 20B is disposed also from the bottom surface of the reaction material spray nozzle N3B to the bottom surface of the exhaust nozzle N4 so as to cover the open ceiling part 58 from a side where the substrate 23 is disposed (refer to FIG. 5, FIG. 7 and Fig. 8B).

In order to enable to spray the inert gas to the substrate 23, as with Embodiment 1, an inert gas supply part 54, a passage 74, and a plurality of inert gas ejection ports 194 are also provided in the base plate 20B according to the present embodiment. Furthermore, in the base plate 20B of Embodiment 2, as with Embodiment 1, the temperature adjustment mechanism 22 is disposed.

In Embodiment 2, the temperature adjustment mechanism 22 is also disposed in the reaction material spray nozzle N3B. In addition, in the mist spray head 100B, temperature adjustment of the raw material solution spray nozzle N1B is performed by a part of the temperature adjustment mechanism 22 disposed in the base plate 20B.

In addition, also in Embodiment 2, the mist spray head 100B has a frame 30 on a side (bottom surface) facing the substrate 23. Further, as shown in FIG. 5, as with Embodiment 1 also in Embodiment 2, the inert gas supply part 51, the passage 71, and the inert gas ejection port 191 of the inert gas spray part 81, an inert gas supply part 55, a passage 75, and an inert gas ejection port 195 are provided in the mist spray head 100B.

When the atomized raw material solution and reaction material are sprayed into the reaction space, the raw material solution and the reaction material react on the heated substrate 23, and a desired film is formed on the upper surface of the substrate 23. The reaction residues and the like in the reaction space are excluded from the reaction space by the exhaust nozzle N4.

(Inert Gas Ejection Ports 192B and 193B, etc.)

As with Embodiment 1, the inert gas spray part 81 is provided in the frame 30 or in a region adjacent to the frame 30 at the end of the mist spray head 100B of Embodiment 2 (end on the −X direction side in FIG. 5). Further, inert gas spray parts 82B and 83B are formed inside the reaction material spray nozzle N3B of the mist spray head 100B.

The inert gas spray part 81 is mainly composed of an inert gas supply part 51, a passage 71, and an inert gas ejection port 191. The inert gas spray part 82B is mainly composed of an inert gas supply part 52B, a passage 72B, and an inert gas ejection port 192B. The inert gas spray part 83B is mainly composed of an inert gas supply part 53B, a passage 73B, and an inert gas ejection port 193B.

As shown in FIG. 5, the inert gas spray part 82B is provided below the cavity 13B in the reaction material spray nozzle N3B, and the main part (passage 73B around the inert gas supply part 53B) of the inert gas spray part 83B is formed below the main part (the passage 72B around the inert gas supply part 52B) of the inert gas spray part 82B. Here, the inert gas spray parts 82B and 83B are spaces formed independently from other spaces.

As shown in FIGS. 5, 6 and Fig. 8B, inert gas supply parts 52B and 53B are provided in the side surface in the Y direction in the inert gas spray parts 82B and 83B. The inert gas supply parts 52B and 53B are connected to the inert gas ejection ports 192B and 193B formed in the bottom surface of the reaction material spray nozzle N3B through the passages 72B and 73B formed in the reaction material spray nozzle N3B.

As shown in FIG. 5 and FIG. 6, in the inert gas spray parts 82B and 83B, the inert gas introduced from the outside into the inert gas supply parts 52B and 53B is guided to the inert gas ejection ports 192B and 193B, respectively, formed in the bottom surface of the mist spray head 100B through the passages 72B and 73B, and are ejected via the inert gas openings 392B and 393B, respectively, of the bottom plate 21B.

The inert gas supply parts 51, 52B and 53B communicate with the inert gas ejection ports 191, 192B and 193B, respectively, but the opening area of each of the inert gas supply parts 51, 52B and 53B is desirably set to an area equal to or greater than the opening area of each of the inert gas ejection ports 191, 192B and 193B.

Furthermore, it is desired that the flow rate at which each of the inert gas ejection ports 191, 192B and 193B ejects the inert gas is set to each of a flow rate at which the raw material solution ejection port 15B ejects the raw material solution and flow rates at which the reaction material ejection ports 16B and 17B eject the reaction material or less.

Furthermore, as shown in FIG. 6, as with Embodiment 1, the inert gas introduced into the two inert gas supply parts 55 provided at both ends in the Y direction flows through the passages 75, and is ejected from two inert gas ejection ports 195 formed in the bottom surface of the mist spray head 100B as shown in FIG. 7.

As described above, the inert gas ejection port 195 is provided in the frame 30 or in the region adjacent to the frame 30 described above.

With the above-described configuration, the inert gas sent from the outside of the mist spray head 100B through the inert gas supply parts 51, 52B and 53B of the inert gas spray parts 81, 82B and 83B and the inert gas supply part 55 is supplied into the mist spray head 100B. The passages 71, 72B and 73B and the passage 75 are provided in the mist spray head 100B, and the supplied inert gas propagates through the passages 71, 72B and 73B and the passage 75. The inert gas ejection ports 191, 192B and 193B and the inert gas ejection port 195 are provided in the bottom surface (side facing the substrate 23) of the mist spray head 100B, and the inert gas is sprayed from the inert gas ejection ports 191, 192B and 193B and the inert gas ejection port 195 (via the inert gas openings 392B and 393B in the inert gas ejection ports 192B and 193B) toward the upper surface of the substrate 23.

The exhaust nozzle N4 is disposed separately from the other nozzles N1B and N3B in the X direction. Accordingly, an open ceiling part 58 is generated between the exhaust nozzle N4 and the other nozzles N1B and N3B. Thus, the mist spray head 100B includes the base plate 20B. The base plate 20B covers the open ceiling part 58 from a side where the substrate 23 is disposed (refer to FIG. 5, FIG. 7 and Fig. 8B).

As shown in FIG. 5, FIG. 7 and Fig. 8B, the inert gas supply part 54 (refer to Fig. 8B), the passage 74 (refer to FIG. 5, FIG. 7), and the plurality of inert gas ejection ports 194 are provided in the base plate 20B of the mist spray head 100B of Embodiment 2.

In the base plate 20B, the inert gas sent from the outside of the mist spray head 100B via the inert gas supply parts 54 is supplied to the base plate 20B. The passage 74 is provided in the base plate 20B, and the supplied inert gas propagates through the passage 74. The plurality of inert gas ejection ports 194 are provided in the bottom surface (side facing the substrate 23) of the base plate 20B, and the inert gas is sprayed from the plurality of inert gas ejection ports 194 toward the upper surface of the substrate 23 via the inert gas opening 394 of the bottom plate 21B.

As shown in FIG. 7, the inert gas ejection ports 191 to 194 (191, 192B, 193B, and 194) each have a slit shape which is an elongated opening hole whose longitudinal direction is the Y direction (first direction) in plan view. On the other hand, the inert gas ejection port 195 has a slit shape which is an elongated opening hole whose longitudinal direction is the X direction (second direction) in plan view. The width of the opening of each of the inert gas ejection ports 191 to 195 (the dimension in the X direction in Fig. 7 with the inert gas ejection ports 191 to 194, and the dimension in the Y direction in Fig. 7 with the inert gas ejection port 195) is about 0.1 mm to 10 mm.

As shown in FIGS. 5 and 7, in the bottom surface of the reaction material spray nozzle N3B, the inert gas ejection port 192B is provided between the raw material solution ejection port 15B and the reaction material ejection port 17B, and the inert gas ejection port 193B is provided between the raw material solution ejection port 15B and the reaction material ejection port 16B. That is, in the bottom surface of the mist spray head 100B of Embodiment 2, it is characterized that the inert gas ejection ports 192B and 193B are provided between the raw material solution ejection port 15B and the reaction material ejection ports 17B and 16B, respectively.

Further, in the mist spray head 100B of Embodiment 2, the bottom surface of the reaction material spray nozzle N3B and the bottom surface of the base plate 20B are configured so as to be flush. Accordingly, the raw material solution ejection port 15B, the reaction material ejection ports 16B and 17B, and the inert gas ejection ports 192B, 193B and 194 are provided in a flush bottom surface of the mist spray head 100B.

(Bottom Plate 21B)

The film forming device according to Embodiment 2 is characterized by including a bottom plate 21B detachably provided on the bottom surface of the mist spray head 100B. At this time, the bottom plate 21B is attached to the bottom surface of the mist spray head 100B in the form of not disturbing the execution of the film forming processing by the film forming device.

In addition, a thickness of the bottom plate 2B is set to, for example, about 1.0 to 1.5 mm, and attachment of the bottom plate 21B to the bottom surface of the mist spray head 100 may be screw fastening or the like.

Specifically, as shown in Fig. 5, the bottom plate 21B includes the raw material solution opening 35B, the reaction material openings 36B and 37B, and the inert gas openings 392B to 394 (392B, 393B, and 394) in the region corresponding to the raw material solution ejection port 15B, the reaction material ejection ports 16B and 17B, and the inert gas ejection ports 192B to 194 (192B, 193B, and 194)) when the bottom plate 21B is attached to the bottom surface of the mist spray head 100B.

The raw material solution opening 35B is formed, in a region corresponding to the raw material solution ejection port 15B, in a slit shape which is an elongated opening hole whose longitudinal direction is the Y direction (first direction) in plan view. That is, the raw material solution opening 35B is formed in the same shape that coincides with a shape of the raw material solution ejection port 15B in a plan view when attaching the bottom plate 21B.

The reaction material openings 36B and 37B are each formed, in regions corresponding to the reaction material ejection ports 16B and 17B, in a slit shape which is an elongated opening hole whose longitudinal direction is the Y direction (first direction) in a plan view. That is, the reaction material openings 36B and 37B are formed in the same shapes that coincide with shapes of the reaction material ejection ports 16B and 17B, respectively, in a plan view when attaching the bottom plate 21B.

The inert gas openings 392B to 394 are each formed, in regions corresponding to the inert gas ejection ports 192B to 194, in a slit shape which is an elongated opening hole whose longitudinal direction is the Y direction (first direction) in a plan view. That is, the inert gas openings 392B to 394 are formed in the same shapes that coincide with shapes of the inert gas ejection ports 192B to 194, respectively, in a plan view when attaching the bottom plate 21B.

Accordingly, the bottom plate 21B has no effect on the film forming processing by the film forming device of Embodiment 2 regarding the raw material solution ejection port 15B, the reaction material ejection ports 16B and 17B, and the inert gas ejection ports 192B to 194 when the bottom plate 21B is attached.

Since the exhaust port 18 and the inert gas ejection ports 191 and 195 are provided on the outermost side of the mist spray head 100B, the bottom plate 21B is disposed in the vicinity of the exhaust port 18 and the like without covering the exhaust port 18 and the inert gas ejection ports 191 and 195 when the bottom plate 21B is attached to the bottom surface of the mist spray head 100B.

As described above, in the frame 30 of the bottom surface of the mist spray head 100B shown in FIG. 7, the bottom plate 21B is formed from the vicinity of the exhaust port 18 to the vicinity of the inert gas ejection port 191 without covering the exhaust port 18 and the inert gas ejection port 191.

Accordingly, the bottom plate 21B has no effect on the film forming processing by the film forming device of Embodiment 2 regarding the exhaust port 18 and the inert gas ejection ports 191 and 195 when the bottom plate 21B is attached. As described above, the bottom plate 21B is attached to the bottom surface of the mist spray head 100B in the form of not disturbing the execution of the film forming processing by the film forming device.

Further, the bottom plate 21B is made of a material having corrosion resistance similarly to the bottom plate 21 of Embodiment 1.

(Effect etc.)

The film forming device of Embodiment 2 can easily remove the reaction products adhering to the bottom plate 21B by providing the detachable bottom plate 21B on the bottom surface of the mist spray head 100B and washing the bottom plate 21B after removing the bottom plate 21B.

Furthermore, it is possible to keep on using a film forming device while cleaning one bottom plate by preparing a plurality of bottom plates 21B in advance, and using another washed bottom plate while one bottom plate among the plurality of bottom plates 21B is cleaned.

Furthermore, the film forming device of Embodiment 2 can easily remove the reaction products adhering to the bottom plate 21B without disturbing film forming processing at the time of attaching the bottom plate 21B by providing the raw material solution opening 35B, the reaction material openings 36B and 37B, and the inert gas openings 392B to 394 in the bottom plate 21B.

Since the bottom plate 21B is disposed without covering the exhaust port 18 and the inert gas ejection ports 191 and 195 when the bottom plate 21B is attached to the bottom surface of the mist spray head 100B, the film forming processing including the exhaust processing is not affected when attaching the bottom plate 21B.

Further, the raw material solution ejection port 15B, the reaction material ejection ports 16B and 17B, and the inert gas ejection ports 191 to 194 formed in the bottom surface of the mist spray head 100B of Embodiment 2 are formed in a slit shape in which a first direction (Y direction) is a longitudinal direction. The raw material solution opening 35B, the reaction material openings 36B and 37B, and the inert gas openings 392B to 394 in the bottom plate 21B are formed in the same shapes which coincide with shapes of the raw material solution ejection port 15B, the reaction material ejection ports 16B and 17B, and the inert gas ejection ports 192B to 194, respectively, in a plan view when the bottom plate 21B is attached to the bottom surface of the mist spray head 100B. Therefore, the film forming processing of Embodiment 2 performs the effect that the atomized raw material solution can be evenly sprayed onto the large-area substrate 23, as with Embodiment 1.

Further, composing the bottom plate 21B of a material having corrosion resistance can facilitate the reuse of the bottom plate 21B after the cleaning process.

In the mist spray head 100B of Embodiment 2, the raw material solution spray nozzle N1B has the raw material solution discharge parts 41B and 42B which can discharge the atomized raw material solution and the first reaction material (reaction material supplied from the reaction material supply part 2B) to the reaction material spray nozzle N3B.

On the other hand, the reaction material spray nozzle N3B ejects inert gas from the inert gas ejection ports 193B and 192B (first and second inert gas ejection ports), respectively, and ejects a second reaction material (reaction material supplied from the reaction material supply part 3B) from the reaction material ejection port 17B (second reaction material ejection port) via the reaction material opening 37B for the reaction material of the bottom plate 21B.

Further, the reaction material spray nozzle N3B has the passages 61B and 62B (first and second internal passages) therein, Passages 61B and 62B guide the raw material solution and the first reaction material, discharged from the raw material solution discharge parts 41B and 42B of the raw material solution spray nozzle N1B, to the raw material solution ejection port 15B and the reaction material ejection port 16B (first reaction material ejection port).

Further, the reaction material spray nozzle N3B has the passages 61B and 62B (first and second internal passages) therein which guide the raw material solution and the first reaction material discharged from the raw material solution discharge parts 41B and 42B of the raw material solution spray nozzle N1B to the raw material solution ejection port 15B and the reaction material ejection port 16B (first reaction material ejection port).

The mist spray head 100B of Embodiment 2 having the above configuration is characterized in that by combined configuration of the raw material solution spray nozzle N1B and the reaction material spray nozzle N3B, the inert gas ejection ports 193B and 192B are provided between the raw material solution ejection port 15B and the reaction material ejection ports 16B and 17B, respectively.

Therefore, in the film forming device of Embodiment 2, as with Embodiment it is possible to reduce the adhesion of reaction products to each of the vicinity of the raw material solution opening 35B and vicinities of the reaction material openings 36B and 37B of the bottom plate 21. As a result, the film forming device of Embodiment 2 achieves the effect that cleaning of the bottom plate 21B can be performed more easily.

Further, in the film forming device of Embodiment 2, by setting the opening area of each of the inert gas supply parts 51, 52B and 53B to an area equal to or greater than the opening area of each of the inert gas ejection ports 191, 192B and 193B, that is, by setting the opening area of each of the inert gas ejection ports 191, 192B and 193B to an area equal to or less than the opening area of each of the inert gas supply parts 51, 52B and 53B, the effect that a pressure difference can be set between the inert gas ejection ports 191, 192B and 193B and the inert gas supply parts 51, 52B and 53B, and the inert gas can be uniformly spread over the upper surface of the substrate 23 at the time of film formation is achieved.

In addition, in the film forming device of Embodiment 2 the flow rate at which each of the inert gas ejection ports 191, 192B and 193B ejects the inert gas is set to each of a flow rate at which the raw material solution ejection port 15B ejects the raw material solution and flow rates at which the reaction material ejection ports 16B and 17B eject the reaction material or less.

Therefore, the film forming device of Embodiment 2 can suppress the phenomenon of impairing the reaction between the raw material solution and the reaction material by ejecting the inert gas.

Furthermore, the film forming device of Embodiment 2 achieves the same effects as in the film forming device of Embodiment 1 and achieves the following effects.

In the mist spray head 100B according to Embodiment 2, two cavities 11 and 12B are provided in one raw material solution spray nozzle N1B, and two type of reaction materials and two inert gases are sprayed from one reaction material spray nozzle N3B toward the substrate 23.

Accordingly, in the case of spraying two types of reaction materials, it is not necessary to provide two reaction material spray nozzles N2 and N3 in the mist spray head 100B as described in Embodiment 2. That is, it is possible to save space in the mist spray head 100B according to Embodiment 2.

Furthermore, in the mist spray head 100B according to Embodiment 2, since the inert gas spray parts 82B and 83B are provided in one reaction material spray nozzle N3B, it becomes unnecessary to independently provide the inert gas spray parts 82 and 83 as distinct from the mist spray head 100 of Embodiment 1, so that it is possible to save space in the mist spray head 100B.

In addition, as with Embodiment 1, the mist spray head 100B has a base plate 20B for covering the open ceiling part 58 from the substrate 23 side. Accordingly, even if the exhaust nozzle N4 is disposed separately from the other nozzles N1B to N3B, it is possible to prevent the raw material solution or the like from flowing from the reaction space to the open ceiling part 58. Further, it is easy to assemble the exhaust nozzle N4 and the other nozzles N1B and N3B in the mist spray head 100B.

<Others>

In the above-described embodiment, the bottom plate 21 (bottom plate 21B) is formed without covering the exhaust port 18 and the inert gas ejection ports 191 and 195 (hereinafter abbreviated as "exhaust port 18 and the like"), but when the exhaust port 18 and the like are formed inside the outermost part of the mist spray head 100 (100B), an opening may be provided in a region of the bottom plate 21 which covers and corresponds to each of the exhaust port 18 and the like.

Further, in the above-described embodiment, the raw material solution opening 35 (35B), the reaction material openings 36 (36B) and 37 (37B), and the inert gas openings 392 to 394 (392B to 394) are formed in the same shapes which coincide with shapes of the raw material solution ejection port 15 (15B), the reaction material ejection ports 16 (16B) and 17 (17B), and the inert gas ejection ports 192 to 194 (192B to 194), respectively, in a plan view when the bottom plate 21 (bottom plate 21B) are attached. However, in a relationship between the raw material solution opening 35 or the like and the raw material solution ejection port 15 or the like, even if some misalignment and difference in size and shape occur, it may be any form as long as it does not disturb the execution of the film forming processing by the film forming device.

In the above-described embodiment, the configuration is described in which the first and second reaction materials are ejected from the reaction material ejection ports 16 and 17 (16B and 17B) to the substrate 23, but a configuration may be employed in which a single reaction material is ejected from a single reaction material ejection port. In this case, it is possible to exert the effect that when a single inert gas ejection port (inert gas ejection port corresponding the inert gas ejection ports 192 and 193 (192B and 193B)) is provided between the raw material solution ejection port 15 (15B) and the single reaction material ejection port, clogging of each of the raw material solution ejection port 15 (15B) and the single reaction material ejection port can be surely avoided.

While this invention has been described in detail, the foregoing description is in all aspects illustrative and the invention is not limited thereto. It is understood that innumerable modifications not illustrated can be envisaged without departing from the scope of the present invention,

The invention claimed is:

1. A film forming device which forms a film on a substrate by spraying an atomized raw material solution in an atmosphere, the film forming device comprising:
   a mount on which the substrate is mounted;
   a mist spray head which is provided opposed to an upper surface of the substrate mounted on the mount, has a raw material solution ejection port and an exhaust port on a bottom surface of the mist spray head, and sprays the raw materials solution from the raw material solution ejection port and performs an exhaust processing from the exhaust port; and a bottom plate detachably provided on the bottom surface of the mist spray head, wherein the bottom plate is attached to the bottom surface of the mist spray head such that the bottom plate does not disturb forming of the film, the mist spray head further includes an reaction material ejection port and an inert gas ejection port in the bottom surface, the mist spray head sprays a reaction material contributing to a reaction with the raw material solution from the reaction material ejection port, and the mist spray head sprays an inert gas from the inert gas ejection port, the bottom plate includes a raw material solution opening open to the atmosphere, a reaction material opening open to the atmosphere, and an inert gas opening open to the atmosphere formed in regions corresponding to the raw material solution ejection port, the reaction material ejection port, and the inert gas ejection port when the bottom plate is attached to the bottom surface of the mist spray head, the raw material solution opening, the reaction material opening, and the inert gas opening are formed in same shapes as the raw material solution ejection port, the reaction material ejection port, and the inert gas ejection port, respectively, and the raw material solution opening, the reaction material opening, and the inert gas opening coincide with the same shapes of the raw material solution ejection port, the reaction material ejection port, and the inert gas ejection port, respectively in a plan view when the bottom plate is attached to the bottom surface of the mist spray head, the raw material solution opening, the reaction material opening, and the inert gas opening are formed in same shapes as the raw material solution ejection port, the reaction material ejection port, and the inert gas ejection port, respectively, and the raw material solution opening, the reaction material opening, and the inert gas opening coincide with the same shapes of the raw material solution ejection port, the reaction material ejection port, and the inert gas ejection port, respectively, in a plan view when the bottom plate is attached to the bottom surface of the mist spray head, the mist spray head comprises a raw material solution spray nozzle for spraying the raw material solution from the raw material solution ejection port, and the raw material solution spray nozzle includes;

a first cavity with a bottom surface and a side surface;

a raw material solution supply which supplies the atomized raw material solution to the first cavity;

a raw material solution discharger the side surface of the first cavity at a position apart from the bottom surface of the first cavity above the bottom surface of the first cavity and apart from the raw material solution supply, and is connected to the raw material solution ejection port.

2. The film forming device according to claim 1, wherein the exhaust port is provided on the outermost side of the mist spray head, and the bottom plate is disposed without covering the exhaust port when the bottom plate is attached to the bottom surface of the mist spray head.

3. The film forming device according to claim 1, wherein the bottom surface of the mist spray head assumes a rectangular shape defined by first and second directions, and said raw material solution ejection port, said reaction material ejection port, and the inert gas ejection port are each formed in a slit shape along the first direction in which the first direction is a longitudinal direction in a plan view.

4. The film forming device according to claim 1, wherein said bottom plate is made of a material having corrosion resistance.

5. The film forming device according to claim 1, wherein the raw material solution spray nozzle further includes;

a first flow-regulator in the first cavity and regulates the flow of the raw material solution.

6. The film forming device according to claim 5, wherein the mist spray head further includes a reaction material spray nozzle which is arranged along a direction which is horizontal to the raw material solution spray nozzle and sprays the reaction material.

7. The film forming device according to claim 1, wherein the inert gas ejection port includes first and second inert gas ejection ports, the reaction material includes first and second reaction materials, the reaction material ejection port includes first and second reaction material ejection ports for ejecting the first and second reaction materials, the mist spray head comprises;

first and second reaction material spray nozzles which are located across the raw material solution spray nozzle and spray the first and second reaction materials from the first and second reaction material ejection ports provided in the bottom surface; and first and second inert gas sprayers for spraying inert gas from the first and second inert gas ejection ports provided in the bottom surface, the first inert gas sprayer is provided between the raw material solution spray nozzle and said first reaction material spray nozzle, and the second inert gas sprayer is provided between the raw material solution spray nozzle and said second reaction material spray nozzle.

8. The film forming device according to claim 1, wherein the inert gas ejection port includes first and second inert gas ejection ports, the reaction material includes first and second reaction materials, the reaction material solution ejection port includes first and second reaction material ejection ports for ejecting the first and second reaction materials, the mist spray head comprises:

a reaction material spray nozzle which is provided adjecent to the raw material solution spray nozzle and has the raw material solution ejection port, the first and second reaction material ports, and the first and second inert gas ejection ports in the bottom surface of the mist spray head, the raw material solution spray nozzle sprays the first reaction material in addition to the spraying of the raw material solution, the raw material solution spray nozzle including a first reaction material discharger which can discharge the first reaction material to the reaction material spray nozzle, the raw material solution discharger can discharge the raw material solution to the reaction material spray nozzle, and the reaction material spray nozzle eject an inert gas from the first and second inert gas ejection ports, respectively, ejects the second reaction material from the second reaction material ejection port, and has first and second internal passages which guide the raw material solution and the first reaction material ejected from the raw material solution discharger and the first reaction material discharger respectively, of the raw material solution spray nozzle to the raw material solution ejection port and the first reaction material ejection port.

9. The film forming device according to claim 6, wherein the reaction material spray nozzle includes:

second cavities;

reaction material suppliers for supplying the reaction material to the inside of said second cavities; and reaction material dischargers provided in side surfaces in the second cavities at positions apart from the bottom surfaces of the second cavities and apart from the reaction material suppliers, and are connected to the reaction material ejection port.

10. The film forming device according to claim 9, wherein the mist spray head further includes an exhaust nozzle for performing an exhaust processing from an exhaust port, and the exhaust nozzle performs the exhaust processing at a flow rate equal to or greater than a sum of a flow rate at which the raw material solution spray nozzle ejects the raw material solution and a flow rate at which the reaction material spray nozzle ejects the reaction material.

11. The film forming device according to claim 10, wherein the exhaust nozzle includes:

a third cavity;

an exhaust material introduction part in a side surface in the third cavity at a position apart from the bottom surface of the third cavity and connected to the exhaust port; and an exhaust material outlet above the exhaust material introduction part and discharges the exhaust material from the third cavity to the outside of the exhaust nozzle.

12. The film forming device according to claim 10, wherein the mist spray head further includes:

an open ceiling between the raw material solution spray nozzle and the exhaust nozzle; and a base plate for covering the open ceiling from a side where the substrate is disposed.

13. The film forming device according to claim 12, wherein a third inert gas ejection port for ejecting an inert gas is provided in the base plate.

14. The film forming device according to claim 10, wherein the raw material solution spray nozzle, the reaction material spray nozzle, and the exhaust nozzle are arranged side by side in a horizontal direction, and at least the exhaust nozzle is located at the outermost side of the mist spray head.

15. The film forming device according to claim 1, wherein the bottom surface of the mist spray head is a lowermost surface of the mist spray head that opposes the substrate.

16. The film forming device according to claim 3, wherein the mist spray head further includes a second inert gas ejection port in the bottom surface and sprays the inert gas from the second inert gas ejection port, the bottom plate includes a second inert gas opening to the atmosphere formed in a region corresponding to the second inert gas ejection port when the bottom plate is attached to the bottom surface of the mist spray head, and the second inert gas ejection port forms a slit shape along the second direction.

17. The film forming device according to claim 5, further including a plurality of flow-regulators each having a rectangular shape in plan view, the plurality of flow-regulators being arranged on opposite side surfaces of the first cavity in an X-Y plane with alternately changing formation heights in the first cavity.

18. The film forming device according to claim 13, wherein the base plate includes a plurality of third inert gas ejection ports.

* * * * *